(12) United States Patent
Das Sharma

(10) Patent No.: US 11,239,843 B2
(45) Date of Patent: Feb. 1, 2022

(54) WIDTH AND FREQUENCY CONVERSION WITH PHY LAYER DEVICES IN PCI-EXPRESS

(71) Applicant: Intel Corporation, Santa Clara, CA (US)

(72) Inventor: Debendra Das Sharma, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/826,001

(22) Filed: Mar. 20, 2020

(65) Prior Publication Data

US 2020/0287548 A1 Sep. 10, 2020

Related U.S. Application Data

(63) Continuation of application No. 16/219,883, filed on Dec. 13, 2018, now Pat. No. 10,601,425.

(60) Provisional application No. 62/678,015, filed on May 30, 2018.

(51) Int. Cl.
| | |
|---|---|
| *G06F 13/40* | (2006.01) |
| *H03K 19/17724* | (2020.01) |
| *G06F 13/38* | (2006.01) |
| *G06F 3/01* | (2006.01) |
| *G06F 1/3203* | (2019.01) |

(52) U.S. Cl.
CPC ....... *H03K 19/17724* (2013.01); *G06F 3/017* (2013.01); *G06F 13/385* (2013.01); *G06F 13/4027* (2013.01); *G06F 1/3203* (2013.01)

(58) Field of Classification Search
CPC ...... G06F 1/3203; G06F 3/017; G06F 13/385; G06F 13/4027; H03K 19/17724
See application file for complete search history.

(56) References Cited

U.S. PATENT DOCUMENTS

| | | | |
|---|---|---|---|
| 6,970,013 B1 * | 11/2005 | Cory | G06F 13/4018 326/38 |
| 7,136,953 B1 | 11/2006 | Bisson et al. | |
| 7,468,754 B2 | 12/2008 | Carlsgaard et al. | |
| 7,469,311 B1 | 12/2008 | Tsu et al. | |
| 7,793,030 B2 | 9/2010 | Jenkins et al. | |
| 7,809,969 B2 | 10/2010 | Sharma et al. | |
| 8,627,156 B1 | 1/2014 | Erickson | |

(Continued)

OTHER PUBLICATIONS

Wikipedia, "PCI Express," Published (2019); available online at https://en.wikipedia.org/wiki/PCI_Express. (24 pages).

(Continued)

*Primary Examiner* — Kurtis R Bahr
(74) *Attorney, Agent, or Firm* — Alliance IP, LLC

(57) ABSTRACT

A system and apparatus can include a first port configured to support a first link width; a second port configured to support a second link width, the second link width different from the first link width; and physical layer logic to receive from the first port a first data block arranged according to the first link width and frequency; create at least one second data block arranged according the second link width and frequency, the at least one second data block including data bytes from the first data block arranged sequentially in the at least one second data block; and transmit the at least one second data block to the second port.

20 Claims, 19 Drawing Sheets

(56) References Cited

U.S. PATENT DOCUMENTS

| | | |
|---|---|---|
| 9,183,171 B2 | 11/2015 | Iyer et al. |
| 9,229,897 B2 | 1/2016 | Iyer et al. |
| 9,244,872 B2* | 1/2016 | Barbiero .............. G06F 13/4027 |
| 9,355,058 B2 | 5/2016 | Iyer et al. |
| 10,601,425 B2 | 3/2020 | Sharma |
| 10,846,247 B2 | 11/2020 | Sharma |
| 2005/0160212 A1 | 7/2005 | Caruk |
| 2006/0023633 A1 | 2/2006 | Caruk et al. |
| 2007/0150762 A1 | 6/2007 | Sharma et al. |
| 2007/0234080 A1 | 10/2007 | Mackey et al. |
| 2009/0040373 A1 | 2/2009 | Lo |
| 2011/0106989 A1 | 5/2011 | Solomon et al. |
| 2011/0158261 A1 | 6/2011 | Chen |
| 2011/0222111 A1 | 9/2011 | Shima |
| 2012/0005512 A1* | 1/2012 | Chew ................... G06F 1/3203 713/324 |
| 2012/0079156 A1 | 3/2012 | Safranek et al. |
| 2012/0082463 A1* | 4/2012 | Kasprzyk ............... H04B 10/40 398/140 |
| 2014/0114887 A1* | 4/2014 | Iyer ........................ G06N 20/00 706/12 |
| 2014/0115207 A1 | 4/2014 | Iyer et al. |
| 2014/0195833 A1* | 7/2014 | Wang .................... G06F 1/3203 713/320 |
| 2016/0147705 A1* | 5/2016 | Arroyo ............... G06F 13/4027 714/15 |
| 2016/0179647 A1* | 6/2016 | Das Sharma ......... H03M 13/09 714/736 |
| 2016/0179730 A1 | 6/2016 | Halleck et al. |
| 2016/0182154 A1* | 6/2016 | Fang .................. H04B 10/2575 398/116 |
| 2016/0283375 A1* | 9/2016 | Das Sharma ......... G06F 12/084 |
| 2016/0377679 A1* | 12/2016 | Froelich ........... G01R 31/31703 714/735 |
| 2017/0116090 A1 | 4/2017 | Arroyo et al. |
| 2017/0163286 A1* | 6/2017 | Wu ........................ G06F 13/36 |
| 2017/0351640 A1* | 12/2017 | Nilange .............. G06F 13/4291 |
| 2019/0041898 A1 | 2/2019 | Harriman et al. |
| 2019/0042524 A1 | 2/2019 | Sharma |
| 2019/0131974 A1 | 5/2019 | Sharma |
| 2019/0196991 A1 | 6/2019 | Sharma |
| 2020/0226084 A1 | 7/2020 | Sharma |

OTHER PUBLICATIONS

EPO; Extended European Search Report issued in EP Patent Application No. 20155557.0, dated May 25, 2020; 11 pages.

USPTO; Non-Final Office Action issued in U.S. Appl. No. 16/293,269, dated Jan. 24, 2020; 15 pages.

USPTO; Notice of Allowance issued in U.S. Appl. No. 16/293,269, dated Jul. 29, 2020; 5 pages.

U.S. Appl. No. 17/076,739, filed Oct. 21, 2020; 67 pages.

EPO; Extended European Search Report issued in EP Patent Application No. 20217133.6, dated Jun. 10, 2021; 16 pages.

USPTO; Non-Final Office Action issued in U.S. Appl. No. 16/023,739, dated Aug. 23, 2021; 41 pages.

* cited by examiner

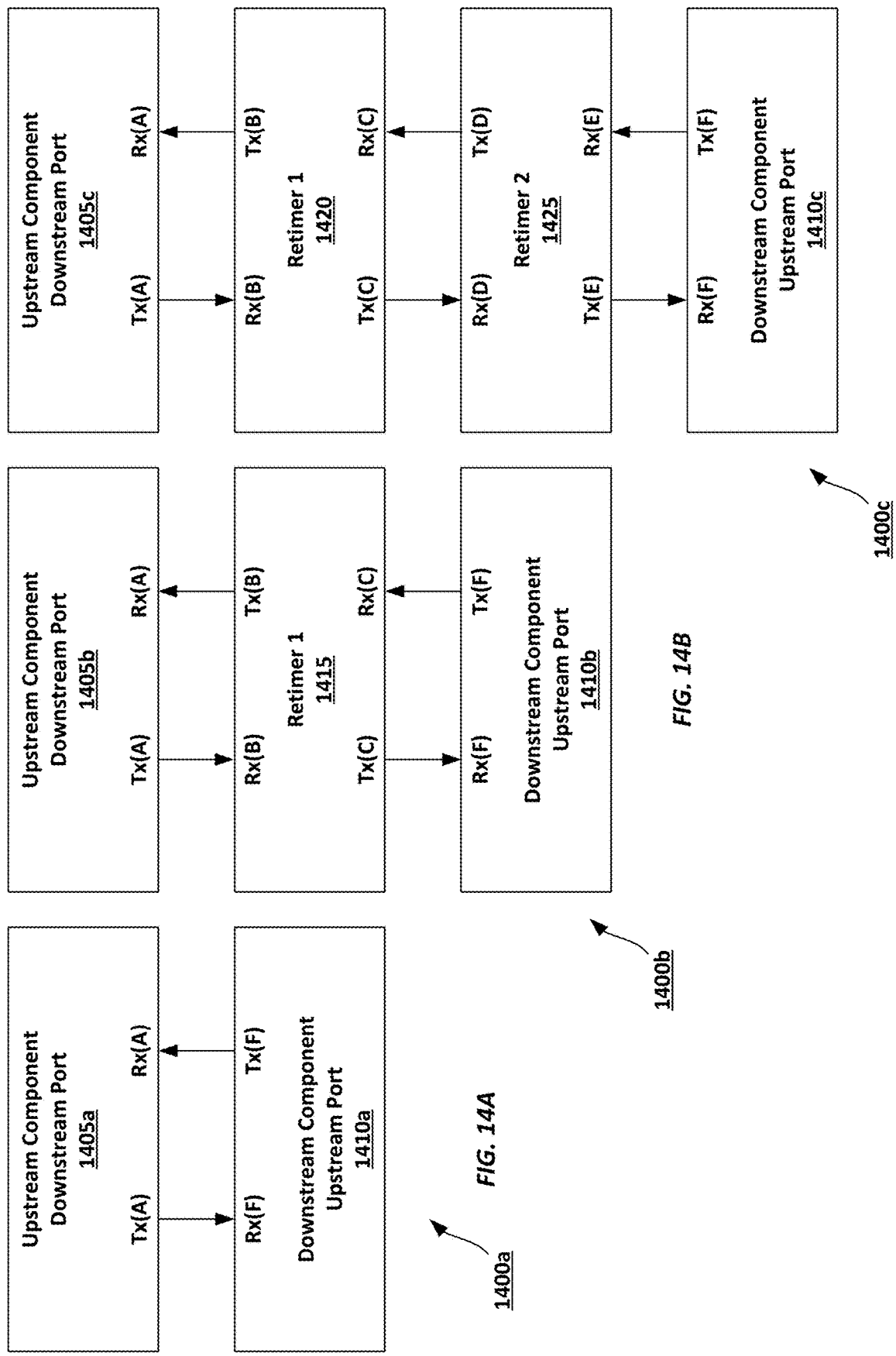

WIDTH AND FREQUENCY CONVERSION WITH PHY LAYER DEVICES IN PCI-EXPRESS

REFERENCE TO RELATED APPLICATION

This application is a continuation (and claims the benefit of priority under 35 U.S.C. § 120) of U.S. patent application Ser. No. 16/219,883, filed on Dec. 13, 2018, entitled WIDTH AND FREQUENCY CONVERSION WITH PHY LAYER DEVICES IN PCI-EXPRESS, which claims the benefit of U.S. Provisional Patent Application Ser. No. 62/678,015 filed May 30, 2018, the entire contents of which are incorporated by reference herein.

BACKGROUND

Interconnects can be used to provide communication between different devices within a system, some type of interconnect mechanism is used. One typical communication protocol for communications interconnects between devices in a computer system is a Peripheral Component Interconnect Express (PCI Express™ (PCIe™)) communication protocol. This communication protocol is one example of a load/store input/output (I/O) interconnect system. The communication between the devices is typically performed serially according to this protocol at very high speeds.

Devices can be connected across various numbers of data links, each data link including a plurality of data lanes. Upstream devices and downstream devices undergo link training upon initialization to optimize data transmissions across the various links and lanes.

BRIEF DESCRIPTION OF THE DRAWINGS

FIG. 5C1-5C2 are process flow diagrams for performing width and frequency conversion by a converter chip in accordance with embodiments of the present disclosure.

FIGS. 14A-14C are simplified block diagrams illustrating example implementations of a link interconnecting two components in accordance with embodiments of the present disclosure.

DETAILED DESCRIPTION

Figure 1:
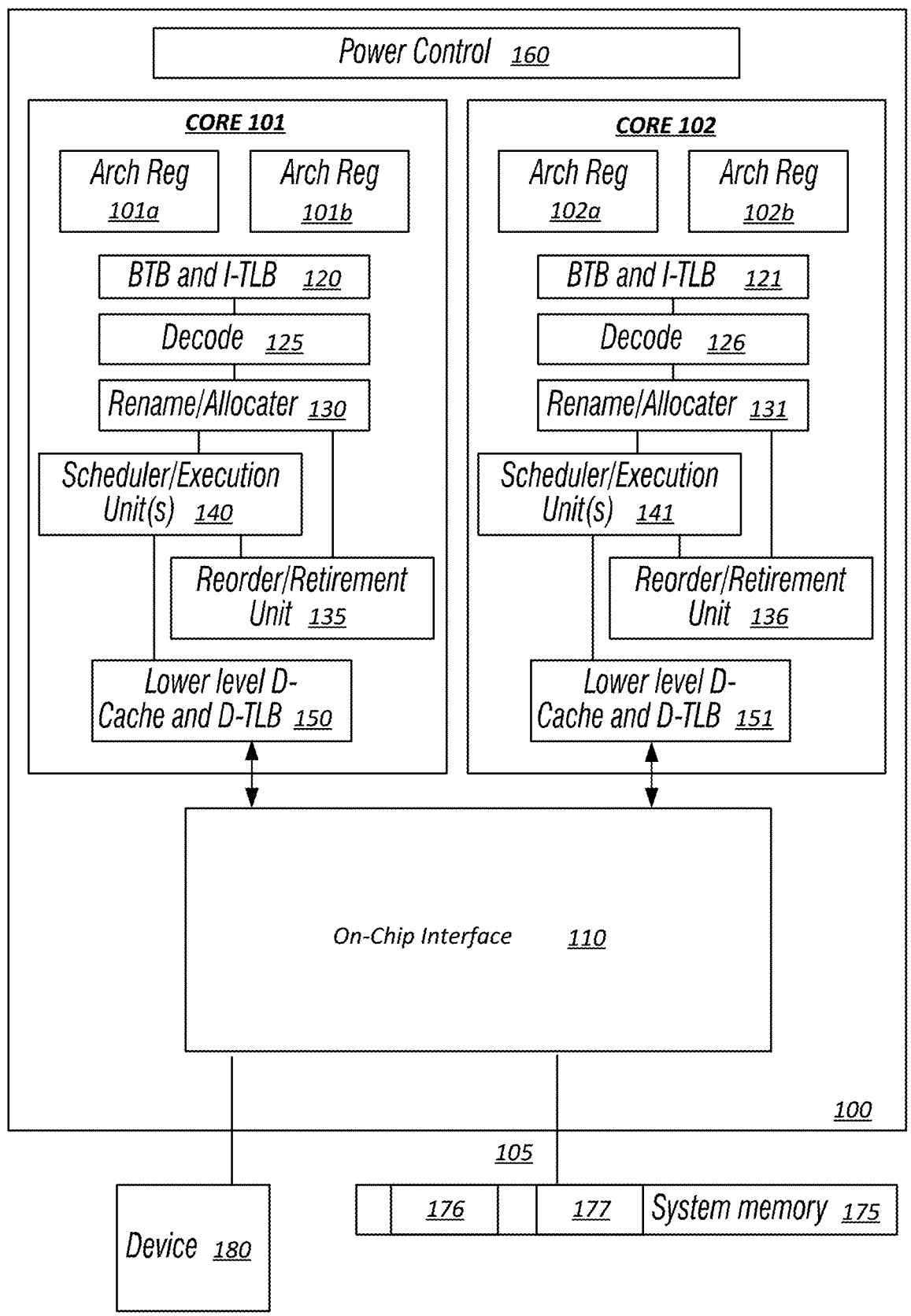
FIG. 1 illustrates an embodiment of a block diagram for a computing system including a multicore processor.

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, to one skilled in the art that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system have not been described in detail in order to avoid unnecessarily obscuring the present disclosure.

Although the following embodiments may be described with reference to energy conservation and energy efficiency in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to desktop computer systems or Ultrabooks™. And may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatus', methods, and systems described herein are not limited to physical computing devices, but may also relate to software optimizations for energy conservation and efficiency. As will become readily apparent in the description below, the embodiments of methods, apparatus', and systems described herein (whether in reference to hardware, firmware, software, or a combination thereof) are vital to a 'green technology' future balanced with performance considerations.

As computing systems are advancing, the components therein are becoming more complex. As a result, the interconnect architecture to couple and communicate between the components is also increasing in complexity to ensure bandwidth requirements are met for optimal component operation. Furthermore, different market segments demand different aspects of interconnect architectures to suit the market's needs. For example, servers require higher performance, while the mobile ecosystem is sometimes able to sacrifice overall performance for power savings. Yet, it is a singular purpose of most fabrics to provide highest possible performance with maximum power saving. Below, a number of interconnects are discussed, which would potentially benefit from aspects of the disclosure described herein.

Referring to FIG. 1, an embodiment of a block diagram for a computing system including a multicore processor is depicted. Processor 100 includes any processor or processing device, such as a microprocessor, an embedded processor, a digital signal processor (DSP), a network processor, a handheld processor, an application processor, a co-processor, a system on a chip (SOC), or other device to execute code. Processor 100, in one embodiment, includes at least two cores—core 101 and 102, which may include asymmetric cores or symmetric cores (the illustrated embodiment). However, processor 100 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 100, as illustrated in FIG. 1, includes two cores—core 101 and 102. Here, core 101 and 102 are considered symmetric cores, i.e. cores with the same configurations, functional units, and/or logic. In another embodiment, core 101 includes an out-of-order processor core, while core 102 includes an in-order processor core. However, cores 101 and 102 may be individually selected from any type of core, such as a native core, a software managed core, a core adapted to execute a native Instruction Set Architecture (ISA), a core adapted to execute a translated Instruction Set Architecture (ISA), a co-designed core, or other known core. In a heterogeneous core environment (i.e. asymmetric cores), some form of translation, such a binary translation, may be utilized to schedule or execute code on one or both cores. Yet to further the discussion, the functional units illustrated in core 101 are described in further detail below, as the units in core 102 operate in a similar manner in the depicted embodiment.

As depicted, core 101 includes two hardware threads 101a and 101b, which may also be referred to as hardware thread slots 101a and 101b. Therefore, software entities, such as an operating system, in one embodiment potentially view processor 100 as four separate processors, i.e., four logical processors or processing elements capable of executing four software threads concurrently. As alluded to above, a first thread is associated with architecture state registers 101a, a second thread is associated with architecture state registers 101b, a third thread may be associated with architecture state registers 102a, and a fourth thread may be associated with architecture state registers 102b. Here, each of the architecture state registers (101a, 101b, 102a, and 102b) may be referred to as processing elements, thread slots, or thread units, as described above. As illustrated, architecture state registers 101a are replicated in architecture state registers 101b, so individual architecture states/contexts are capable of being stored for logical processor 101a and logical processor 101b. In core 101, other smaller resources, such as instruction pointers and renaming logic in allocator and renamer block 130 may also be replicated for threads 101a and 101b. Some resources, such as re-order buffers in reorder/retirement unit 135, ILTB 120, load/store buffers, and queues may be shared through partitioning. Other resources, such as general purpose internal registers, page-table base register(s), low-level data-cache and data-TLB 115, execution unit(s) 140, and portions of out-of-order unit 135 are potentially fully shared.

Processor 100 often includes other resources, which may be fully shared, shared through partitioning, or dedicated by/to processing elements. In FIG. 1, an embodiment of a purely exemplary processor with illustrative logical units/resources of a processor is illustrated. Note that a processor may include, or omit, any of these functional units, as well as include any other known functional units, logic, or firmware not depicted. As illustrated, core 101 includes a simplified, representative out-of-order (OOO) processor core. But an in-order processor may be utilized in different embodiments. The OOO core includes a branch target buffer 120 to predict branches to be executed/taken and an instruction-translation buffer (I-TLB) 120 to store address translation entries for instructions.

Core 101 further includes decode module 125 coupled to fetch unit 120 to decode fetched elements. Fetch logic, in one embodiment, includes individual sequencers associated with thread slots 101a, 101b, respectively. Usually core 101 is associated with a first ISA, which defines/specifies instructions executable on processor 100. Often machine code instructions that are part of the first ISA include a portion of the instruction (referred to as an opcode), which references/specifies an instruction or operation to be performed. Decode logic 125 includes circuitry that recognizes these instructions from their opcodes and passes the decoded instructions on in the pipeline for processing as defined by the first ISA. For example, as discussed in more detail below decoders 125, in one embodiment, include logic designed or adapted to recognize specific instructions, such as transactional instruction. As a result of the recognition by decoders 125, the architecture or core 101 takes specific, predefined actions to perform tasks associated with the appropriate instruction. It is important to note that any of the tasks, blocks, operations, and methods described herein may be performed in response to a single or multiple instructions; some of which may be new or old instructions. Note decoders 126, in one embodiment, recognize the same ISA (or a subset thereof). Alternatively, in a heterogeneous core environment, decoders 126 recognize a second ISA (either a subset of the first ISA or a distinct ISA).

In one example, allocator and renamer block 130 includes an allocator to reserve resources, such as register files to store instruction processing results. However, threads 101a and 101b are potentially capable of out-of-order execution, where allocator and renamer block 130 also reserves other resources, such as reorder buffers to track instruction results. Unit 130 may also include a register renamer to rename program/instruction reference registers to other registers internal to processor 100. Reorder/retirement unit 135 includes components, such as the reorder buffers mentioned above, load buffers, and store buffers, to support out-of-order execution and later in-order retirement of instructions executed out-of-order.

Scheduler and execution unit(s) block 140, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 150 are coupled to execution unit(s) 140. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 101 and 102 share access to higher-level or further-out cache, such as a second level cache associated with on-chip interface 110. Note that higher-level or further-out refers to cache levels increasing or getting further way from the execution unit(s). In one embodiment, higher-level cache is a last-level data cache—last cache in the memory hierarchy on processor 100—such as a second or third level data cache. However, higher level cache is not so limited, as it may be associated with or include an instruction cache. A trace cache—a type of instruction cache—instead may be coupled after decoder 125 to store recently decoded traces. Here, an instruction potentially refers to a macro-instruction (i.e. a general instruction recognized by the decoders), which may decode into a number of micro-instructions (micro-operations).

In the depicted configuration, processor 100 also includes on-chip interface module 110. Historically, a memory controller, which is described in more detail below, has been included in a computing system external to processor 100. In this scenario, on-chip interface 11 is to communicate with devices external to processor 100, such as system memory 175, a chipset (often including a memory controller hub to connect to memory 175 and an I/O controller hub to connect peripheral devices), a memory controller hub, a northbridge, or other integrated circuit. And in this scenario, bus 105 may include any known interconnect, such as multi-drop bus, a point-to-point interconnect, a serial interconnect, a parallel bus, a coherent (e.g. cache coherent) bus, a layered protocol architecture, a differential bus, and a GTL bus.

Memory 175 may be dedicated to processor 100 or shared with other devices in a system. Common examples of types of memory 175 include DRAM, SRAM, non-volatile memory (NV memory), and other known storage devices. Note that device 180 may include a graphic accelerator, processor or card coupled to a memory controller hub, data storage coupled to an I/O controller hub, a wireless transceiver, a flash device, an audio controller, a network controller, or other known device.

Recently however, as more logic and devices are being integrated on a single die, such as SOC, each of these devices may be incorporated on processor 100. For example in one embodiment, a memory controller hub is on the same package and/or die with processor 100. Here, a portion of the core (an on-core portion) 110 includes one or more controller(s) for interfacing with other devices such as memory 175 or a graphics device 180. The configuration including an interconnect and controllers for interfacing with such devices is often referred to as an on-core (or un-core configuration). As an example, on-chip interface 110 includes a ring interconnect for on-chip communication and a high-speed serial point-to-point link 105 for off-chip communication. Yet, in the SOC environment, even more devices, such as the network interface, co-processors, memory 175, graphics processor 180, and any other known computer devices/interface may be integrated on a single die or integrated circuit to provide small form factor with high functionality and low power consumption.

In one embodiment, processor 100 is capable of executing a compiler, optimization, and/or translator code 177 to compile, translate, and/or optimize application code 176 to support the apparatus and methods described herein or to interface therewith. A compiler often includes a program or set of programs to translate source text/code into target text/code. Usually, compilation of program/application code with a compiler is done in multiple phases and passes to transform hi-level programming language code into low-level machine or assembly language code. Yet, single pass compilers may still be utilized for simple compilation. A compiler may utilize any known compilation techniques and perform any known compiler operations, such as lexical analysis, preprocessing, parsing, semantic analysis, code generation, code transformation, and code optimization.

Larger compilers often include multiple phases, but most often these phases are included within two general phases: (1) a front-end, i.e. generally where syntactic processing, semantic processing, and some transformation/optimization may take place, and (2) a back-end, i.e. generally where analysis, transformations, optimizations, and code generation takes place. Some compilers refer to a middle, which illustrates the blurring of delineation between a front-end and back end of a compiler. As a result, reference to insertion, association, generation, or other operation of a compiler may take place in any of the aforementioned phases or passes, as well as any other known phases or passes of a compiler. As an illustrative example, a compiler potentially inserts operations, calls, functions, etc. in one or more phases of compilation, such as insertion of calls/operations in a front-end phase of compilation and then transformation of the calls/operations into lower-level code during a transformation phase. Note that during dynamic compilation, compiler code or dynamic optimization code may insert such operations/calls, as well as optimize the code for execution during runtime. As a specific illustrative example, binary code (already compiled code) may be dynamically optimized during runtime. Here, the program code may include the dynamic optimization code, the binary code, or a combination thereof.

Similar to a compiler, a translator, such as a binary translator, translates code either statically or dynamically to optimize and/or translate code. Therefore, reference to execution of code, application code, program code, or other software environment may refer to: (1) execution of a compiler program(s), optimization code optimizer, or translator either dynamically or statically, to compile program code, to maintain software structures, to perform other operations, to optimize code, or to translate code; (2) execution of main program code including operations/calls, such as application code that has been optimized/compiled; (3) execution of other program code, such as libraries, associated with the main program code to maintain software structures, to perform other software related operations, or to optimize code; or (4) a combination thereof.

Advancements in interconnect protocols and technologies, such as seen from one generation of PCIe to the next, can result in increased data rates and an higher number of lanes from the CPU socket. Adoption and implementation of new technologies can take time, and the higher data rates may not be available for devices using older generations of interconnect protocols. This disclosure describes systems, methods, and devices for delivering higher bandwidth and data rates.

The following examples use PCIe as an example; specifically, the transmission between PCIe Gen 4 and Gen 5 is described for illustrative purposes. It is understood, however, that the systems, methods, and devices described herein can be used in other types of data rates and widths.

This disclosure describes a width and frequency converter (WFC) logic that is implemented in hardware, software, or a combination of hardware and software to connect two devices that each has a different generate link (i.e., different link widths and/or frequencies).

Figure 2:
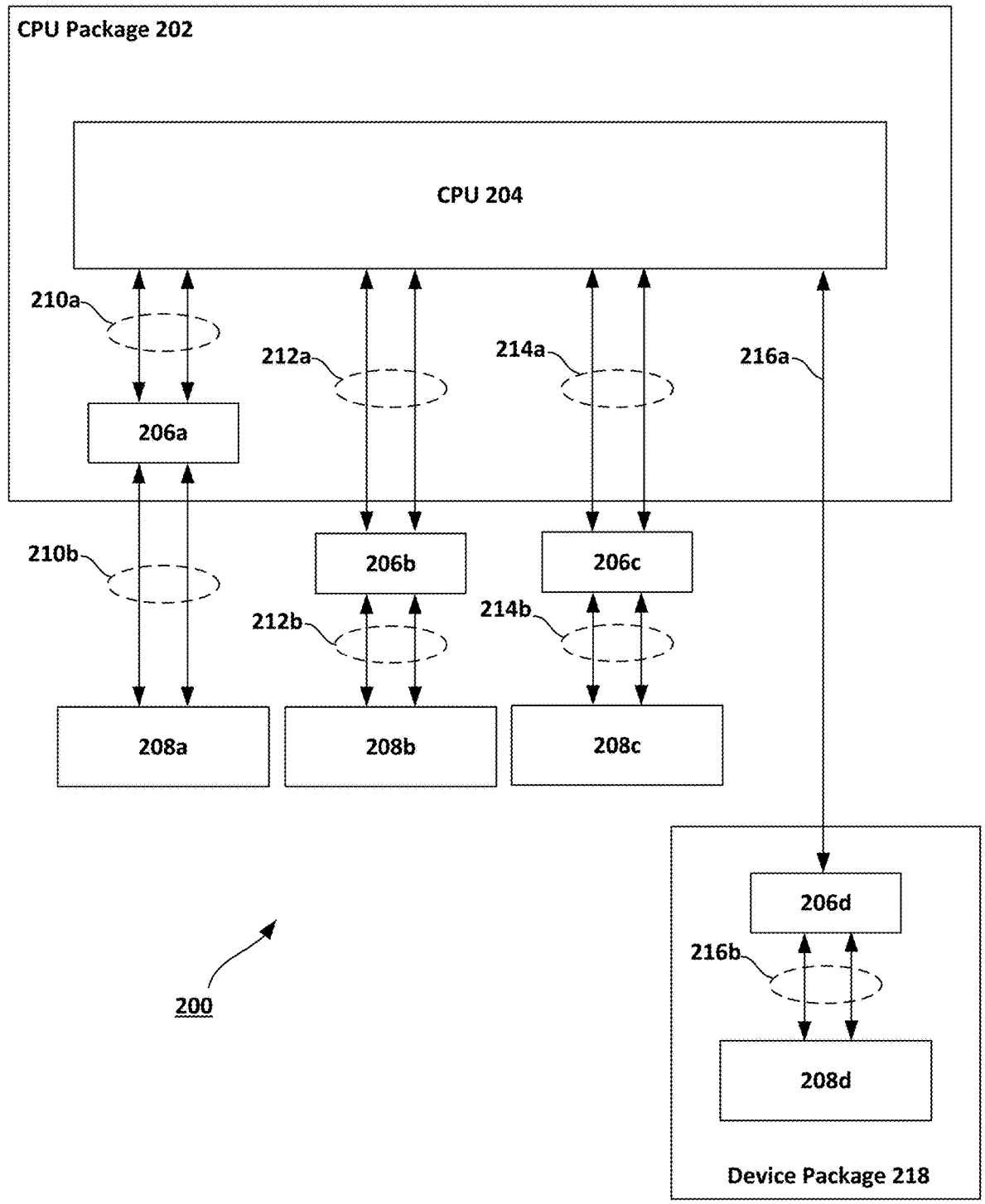
FIG. 2 is a schematic diagram of a computing system illustrating various implementation examples for a width and frequency converter in accordance with embodiments of the present disclosure.

FIG. 2 is a schematic diagram of a computing system 200 illustrating various implementation examples for a width and frequency converter in accordance with embodiments of the present disclosure. The computing system 200 includes a first device 202. First device 202 can be an upstream device, such as a central processing unit, root complex, switch complex, or other type of device that can interface with another device. In FIG. 2, the first device 202 includes a CPU package 202 and a CPU 204. The CPU package 202 can include a root complex or port switch structure, such as those based on a Peripheral Component Interconnect Express (PCIe) protocol. The first device 202 can be coupled to one or more second devices 208a-d.

The computing system 200 can include one or more implementations of a width and frequency converter (WFC) logic. In general, the WFC logic can connect two devices, one device having twice the width than the other device, but at half the frequency. WFC logic can be used on-package or on-board for various types of connectivity as shown in FIG. 2. In some embodiments, WFC logic can be implemented within a retimer. In other embodiments, the WFC logic can be implemented in any PHY layer device, or can be a stand-alone device.

In a first embodiment, WFC logic 206a resides on the CPU package 202. The WFC logic 206a can include circuitry to connect the CPU 204 with a downstream device 208a (e.g., a Gen 5 device). In this first example, the CPU 204 is coupled to the WFC logic 206a by downstream ports (2 x16 Gen 4 ports) at the CPU 204 across a 2 x16 Gen 4 link 210a. The WFC logic 206a links the CPU 204 to the downstream device 208a by upstream ports (2 x8 Gen 5 ports) at the WFC logic across a 2 x8 Gen 5 link 210b.

In a second example, the WFC logic 206b can reside on-board (e.g., on a motherboard or other card that carries the CPU 204; and/or can be in a similar location as a retimer). A downstream device 208b connects its 2 x8 Gen 5 upstream ports to WFC logic 206b across a 2 x8 Gen 5 link 212b. The WFC logic 206b connects the downstream device 208b with the CPU 204 by 2 x16 Gen 4 downstream ports in the CPU 204 across 2 x16 Gen 4 link 212a.

In another example implementation, downstream device 208c connects its 2 x16 Gen 4 upstream ports to the WFC logic 206c using a 2 x16 Gen 4 link 214b. WFC logic 206c connects the downstream device 208c to the CPU 204 by 2 x8 Gen 5 downstream port (please change the diagram 214a to show 2 links (across an x16 Gen 5 link 214a. WFC logic 206c is also on-board, similar to WFC logic 206b.

In another example implementation, downstream device 208d connects its 2 x16 Gen 4 upstream ports to the WFC logic 206d using a 2 x16 Gen 4 link 216b. WFC logic 206d connects the downstream device 208d to the CPU 204 by 2 x8 Gen 5 downstream port across an x16 Gen 5 connector link 216a (which is partitioned as 2 x8 Gen 5 Link in the CPU). WFC logic 206d is similar in connectivity to WFC logic 206c except that the WFC logic 206d is part of device package 218 (e.g., on-package with the downstream device 208d).

Figure 3:
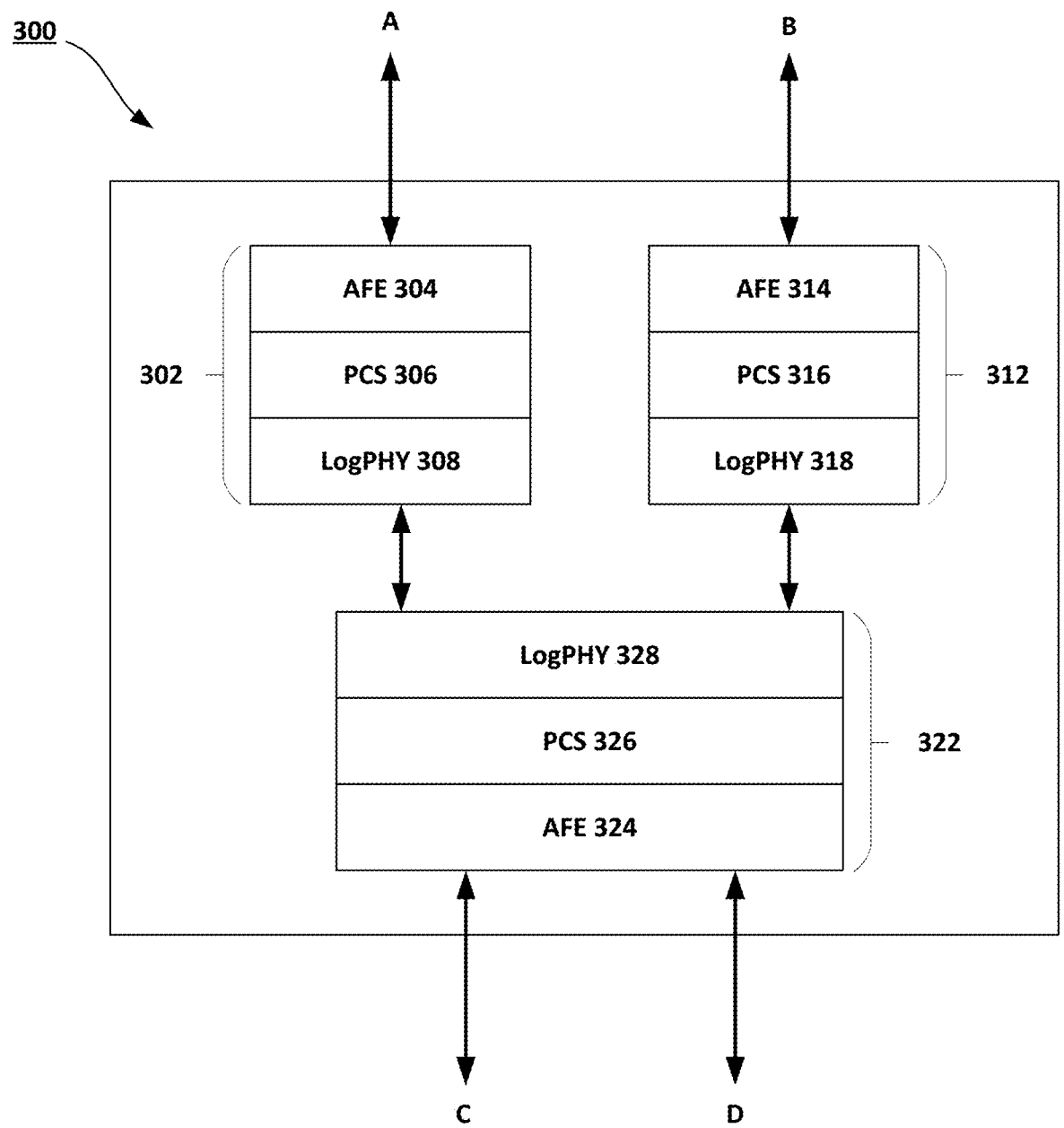
FIG. 3 is a schematic diagram of a width and frequency converter in accordance with embodiments of the present disclosure.

FIG. 3 is a schematic diagram of a width and frequency converter 300 in accordance with embodiments of the present disclosure. The width and frequency converter (WFC) device 300 can be similar in architecture and functionality to the WFC logic 206a-d shown in FIG. 2. FIG. 3 provides an overview of the logical architecture of an example WFC device 300. The WFC device 300 includes PHY layer logic and functionality. A first PHY layer logic element 302 can be implemented in hardware circuitry and can include software or firmware. The first PHY layer logic element 302 can include an analog front end (AFE) 304, a physical coding sublayer (PCS) 306, and a logical PHY 308. A second PHY layer logic element 312 can include an AFE 314, a PCS 316, and a logical PHY 318. A third PHY layer logic element 322 can include an AFE 324, a PCS 326, and a logical PHY 328. The use of the PHY layer logical element 302 facilitates low latency, low board real estate (area), and low power.

The upstream link port 322 can be, for example, a Gen 4 link port that supports one of 1 x16 lane, 2 x8 lanes, 4 x4 lanes, or 1 x8 & 2 x4 lanes. The downstream port 334 can be, for example, a Gen 5 link port that supports a link structure in Gen 5 that corresponds to the Gen 4 link structure: 1 x8 lanes, 2 x4 lanes, 4 x2 lanes, 1 x4 & 2 x2 lanes. The Gen 5 link structure includes half the lane width at twice the frequency. The link port structure and corresponding lanes are provide for example purposes only. The WFC device 300 can also be used to transition from Gen 3 to Gen 4 or Gen 5 to Gen 6, Gen 4 to Gen 3, etc.

The example WFC device 300 can include two x16 ports of Gen n (A and B) that can connect to two x8 ports of Gen n+1 (C and D) while preserving the connectivity of a x16 port to a x16 port at Gen n (i.e., to emulate a retimer function). It should be noted that the WFC device 300 supports partitioning. Thus, if the 16 Lanes of Gen 4 are 1 x8 and 2 x4s, then the corresponding 8 Lanes in Gen 5 will be 1 x4 and 2 x2s. The WFC device 300 uses the Physical (PHY) layer functionality, which includes the analog front end (AFE), the PCS, and the Logical PHY. In embodiments, a multiplexer (MUX) or more than one MUX can be part of the logical PHY or the AFE to perform various conversion operations as described below.

If Port C (or D) is operating at a data rate less than the maximum data rate of Gen n+1, the WFC device 300 can cause the Port A to downshift to half the link width, and act as a retimer with both sides being on the same width and data rate.

Figure 4A:
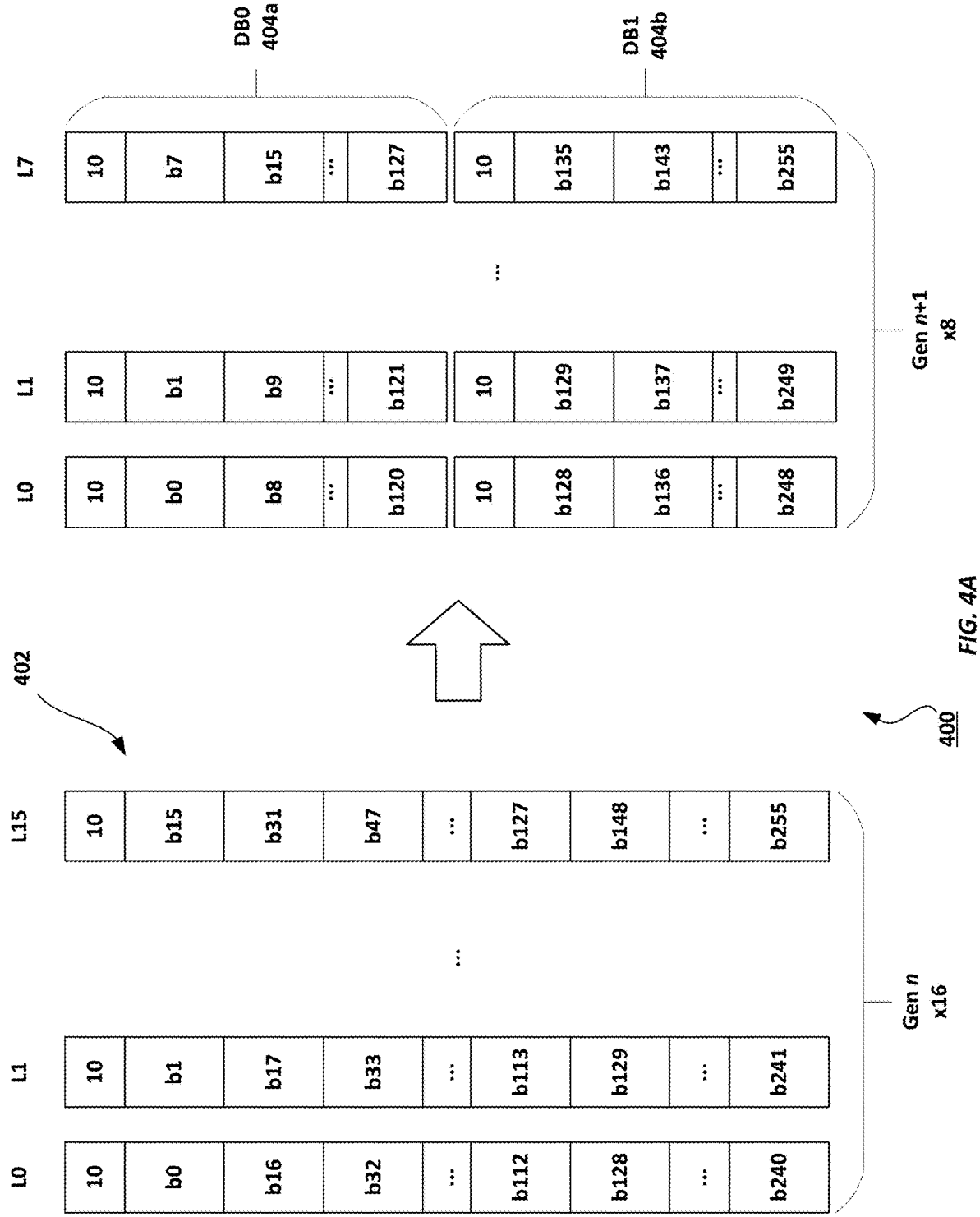
FIG. 4A is a schematic diagram of an example data block conversion from an x16 to an x8 link in accordance with embodiments of the present disclosure.

FIG. 4A is a schematic diagram 400 of an example data block conversion from a x16 Gen n to a x8 Gen n+1 link in accordance with embodiments of the present disclosure. For the case where the WFC device 300 has to perform the width/frequency conversion from a x16 Gen 4 to a x8 Gen 5, the WFC device 300 can take each data block from x16 lanes and convert to 2 data blocks in x8 Lanes, as shown in FIG. 4A for the x16→x8 conversion, while preserving the Symbol placement rules of the underlying interconnect protocol such as PCIe. As an example, a first data block 402 can be formatted for transmission on a Gen n compliant link that uses a 1 x16 link structure. The 256 bytes of data in each Data Block across the Link can be organized sequentially across each of the 16 lanes of the link, starting with a sync header for each lane of the link (10), the data starting with byte b0 in lane L0, byte b1 in lane L1, through b15 in lane L15. Then, b16 would be transmitted in lane L0 and b31 transmitted in lane L15, and so on, so that byte b255 is transmitted in lane L15. In the example of going from Gen 4 to Gen 5, the WFC device (e.g., WFC device 300) rearranges the data from the x16 organization into two 128 byte data blocks DB0 404a and DB1 404b spanning the 8 lanes. The DB0 data block 404a can start with a sync header at each lane, and the data can be organized in a similar fashion as the 1 x16 link: byte b0 starts in lane L0 with byte b7 in lane L7, and so on until byte b120 in lane L0 and byte b128 in lane L7. The second half of the 256 bytes of data can be organized into a second data 128 byte data block DB1 404b. A new sync header begins each lane, and byte b128 begins at lane L0 with the data finishing with byte b255 in Lane L7. Thus, the 256 bytes of data that were received from the x16 link in Gen n can be transmitted across a x8 link in Gen n+1.

For an Ordered Set (OS) Block that comes at the conclusion/start of a data stream, the conversion rules are as follows to generate 2 blocks from one OS block:

SKP (Skip) OS: Generate a SKP OS followed by a Data Block with idles (IDLs);

EIEOS (Electrical Idle Exit Ordered Set): Implies Link goes to Recovery—send EIEOS followed by training Ordered sets;

EIOS (Electrical Idle Ordered Set): implies Link goes to Electric Idle (EI)—take the link to EI after sending out the EIOS; and SDS (Start Data Stream): Send SDS followed by a Data Block of IDL.

Figure 4B:
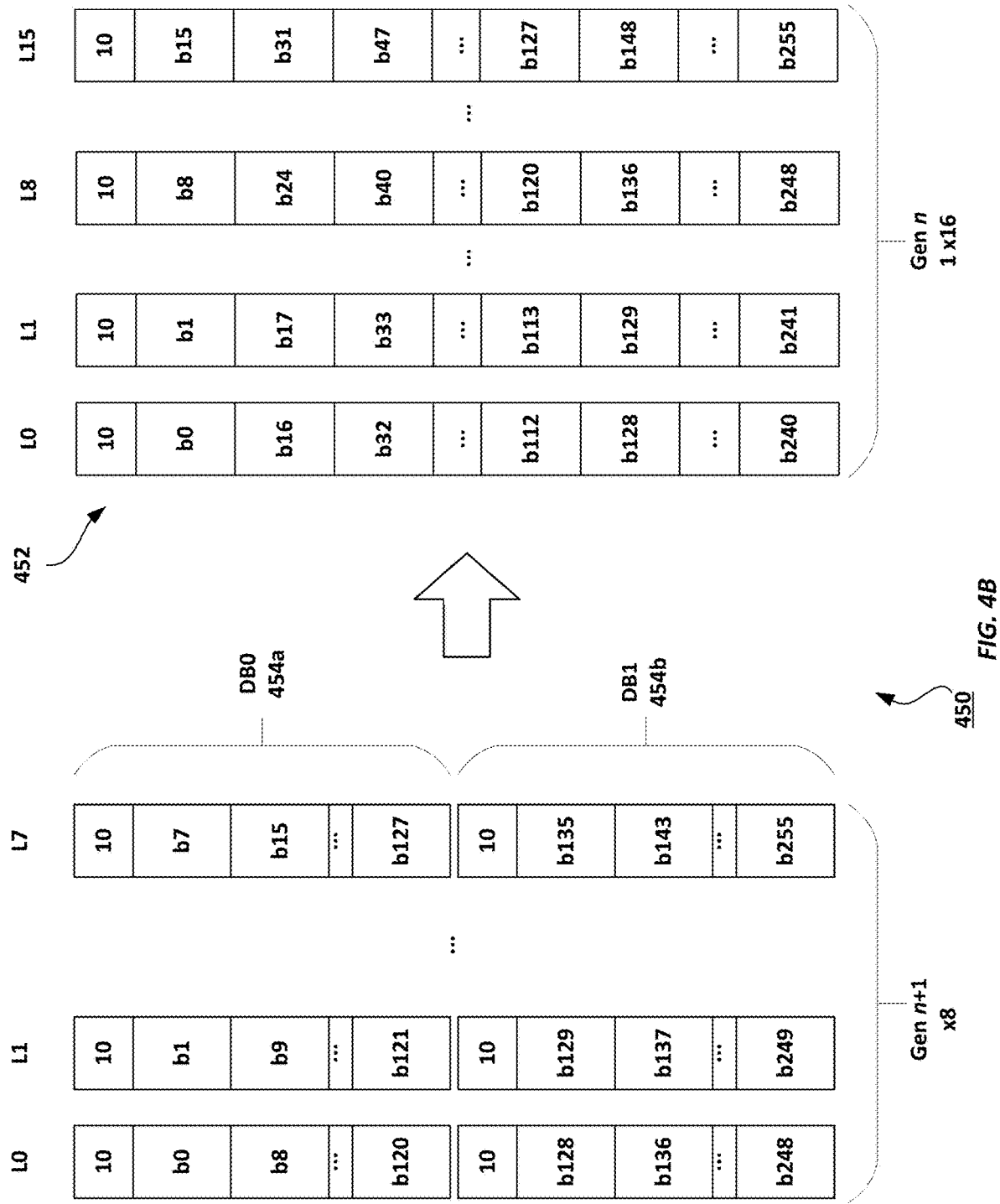
FIG. 4B is a schematic diagram of an example data block conversion from 2 x8 links to an x16 link in accordance with embodiments of the present disclosure.

FIG. 4B is a schematic diagram 450 of an example data block conversion from a x8 link to an x16 link in accordance with embodiments of the present disclosure. For the conversion direction shown in FIG. 4B (e.g., x8 Gen 5 to 1 x16 Gen 4), two 128 byte data blocks in the x8 Gen 5 Link are organized into one 256 byte data block (plus the 2-bit sync header per data block per Lane) in the x16 Gen 4 Link, while preserving PCIe Symbol alignment rules in a similar way as shown in FIG. 4A. The first data block DB0 454a can include a sync header 10 starting each lane. Lane L0 can include byte b0, followed by byte b8, and so on until byte b120. Lane L1 can include a sync header followed by byte b1, b9, . . . b121. Lane L7, therefore, can include a sync header followed by byte b7, b15, . . . b127.

The second data block DB1 454b can include a sync header 10 starting each lane. Lane L0 can include byte b128, followed by byte b136, and so on until byte b248. Lane L1 can include a sync header followed by byte b129, b137, . . . b249. Lane L7, therefore, can include a sync header followed by byte b135, b143, . . . b255.

The WFC device can arrange the data contained in two data blocks 454a and 454b into a single data block 452 that is compliant with an x16 link (e.g., a Gen 4 link, in this example). The data block 452 can include byte b0 in lane L0, byte b1 in lane 1, and byte b15 in lane L15. Byte b16 can be in lane L0, byte b17 in lane L1, and so on with byte b240 in lane L0, byte b241 in lane L1, and byte 255 in lane L15. The symbol placement rules of PCIe are preserved by the conversion of the data blocks. The first data block DB0 454a populates each lane sequentially of the data block 452; the second data block DB1 454b follows immediately after the end of data block DB0 454a to populate the lanes of data block 452. E.g., byte b8 from L0 in DB0 454a would translate to lane L8 in data block 452. Likewise, byte b9 from L1 in DB0 454a would translate to L9 in data block 452, and so on. This allows byte b15 in DB0 454a to translate to lane L15 in data block 452, as shown in FIG. 4B.

Figure 4C:
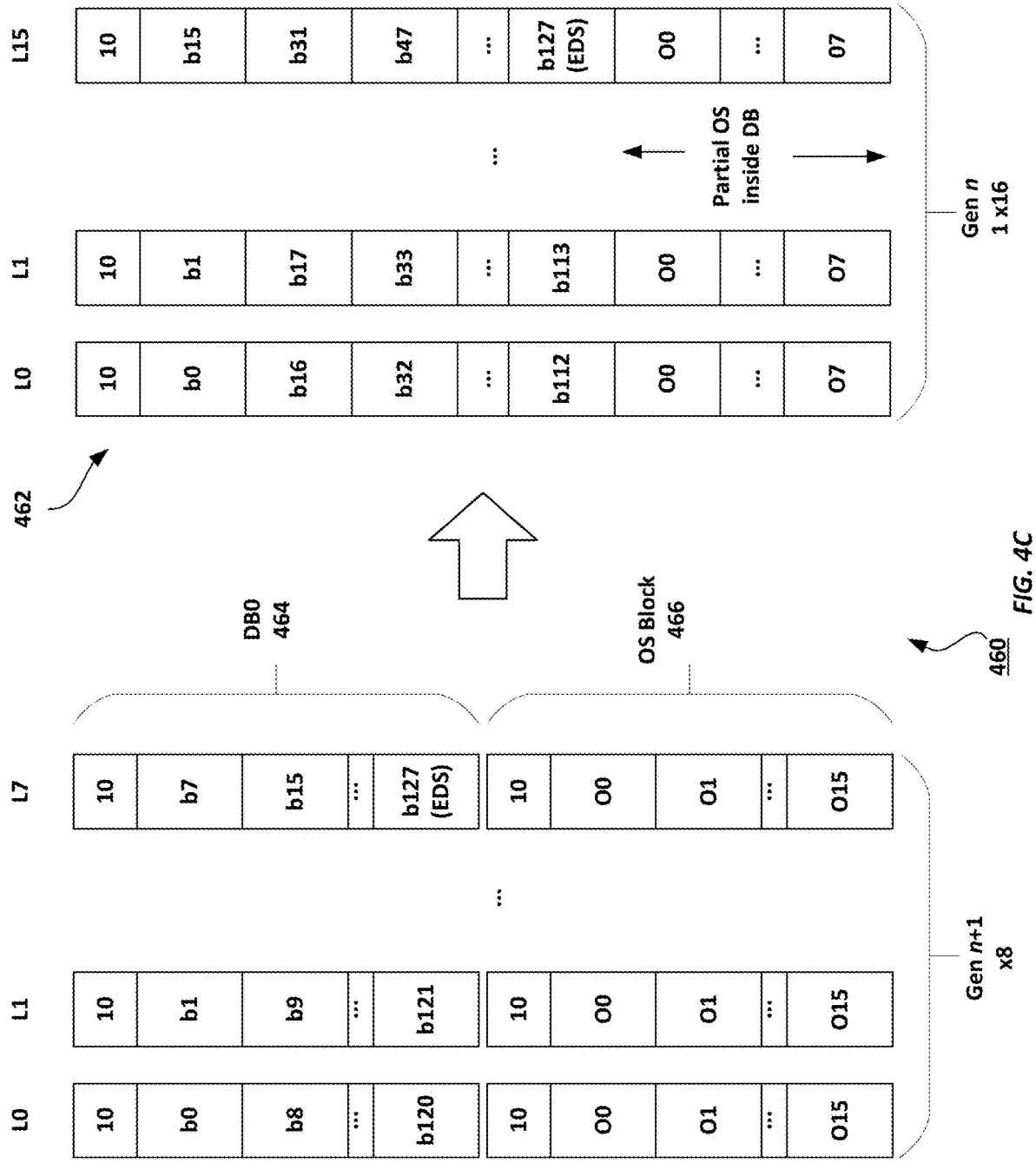
FIG. 4C is a schematic diagram of another example data block conversion from 2 x8 links to an x16 link in accordance with embodiments of the present disclosure.

FIG. 4C is a schematic diagram 460 of another example data block conversion from an x8 Gen n+1 link to a x16 Gen n link in accordance with embodiments of the present disclosure. In embodiments, the WFC device can receive an Ordered Set (OS) block after a data block. The OS block can include SKiP OS, EIOS, or EIEOS. Unlike a data block, Ordered Set block cannot be interleaved across two lanes. Thus, the length of the OS block needs to be reduced by half and a data block and an Ordered Set Block may have to co-exist in the same block. An example of handling that scenario is demonstrated in FIG. 4C. The following rules must be followed for the Data Block followed by an Ordered Set (or vice-versa):

DB0 464 includes data and an end data stream (EDS) and OS Block 466 includes an ordered set block.

Sending partial OS following the EDS if on odd boundary (variable length block if SKP OS follows). The EDS ends the data block prior to the end of data block 462. The data block ordering is similar as in FIG. 4B for DB0 464 to data block 462. The partial OS will populate the remaining bytes of the lanes.

The following rules govern the action of the WFC device, based on the OS block received.

If EIEOS—resume training; If EIOS: take link to EI;

If OS is on even boundary, send the partial OS followed by half a block of data if SKP OS (variable length block, send half the SKP Symbols);

If OS is on even boundary and EIEOS: Send EIEOS and then resume training;

If OS is on even boundary and EIOS: Send EIOS and take link EI;

An alternative approach would be to require the transmitter Port to send two back to back Ordered Sets on an even block boundary so that the converter chip can send one full Ordered Set. Even in this scenario, for SKP Ordered Sets, it must send only half of the Symbols received across the two Ordered Sets (i.e., SKP Ordered Set can be variable length, as expected).

Figure 5A:
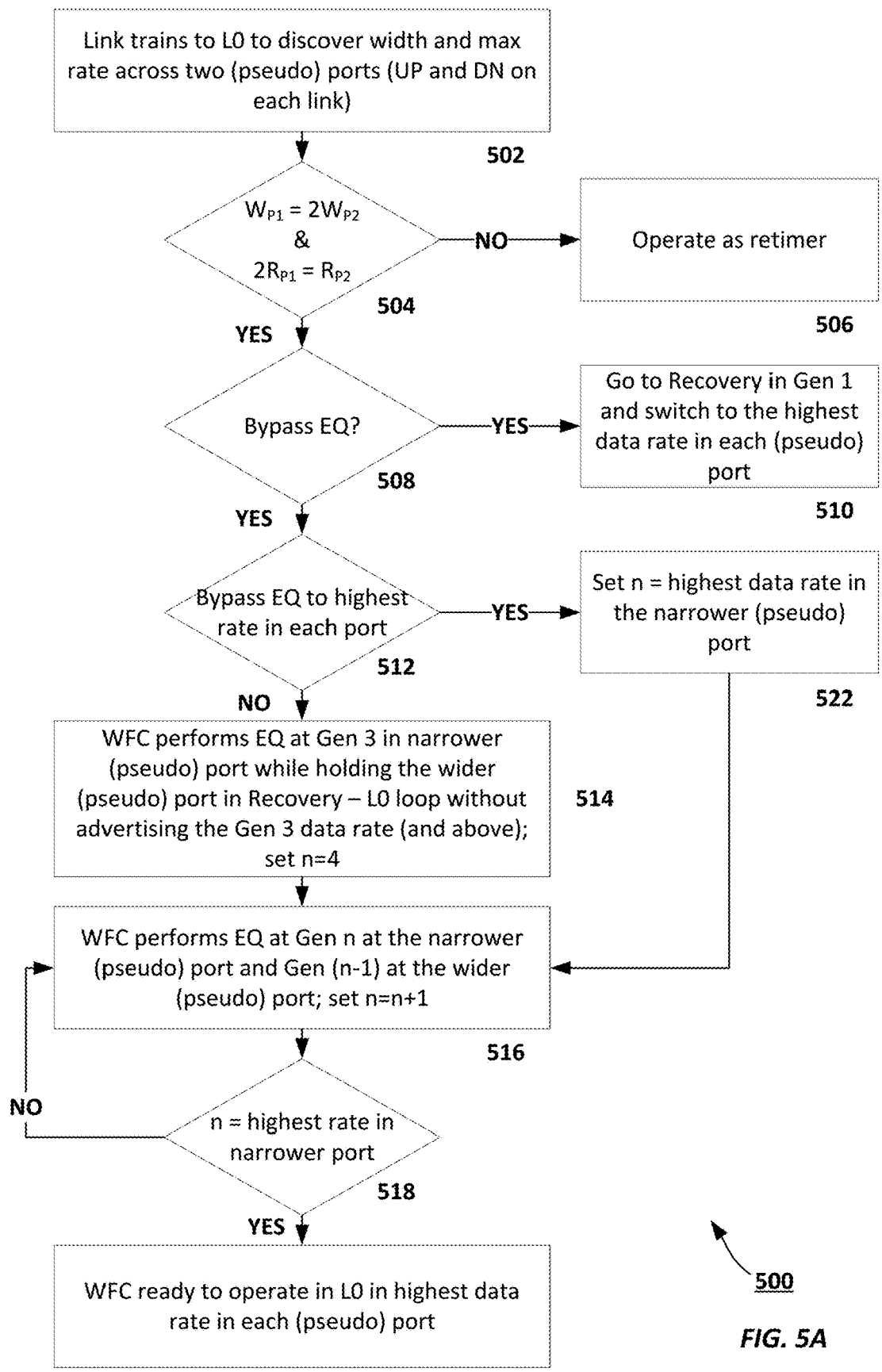
FIG. 5A is a process flow diagram for link training for a width and frequency converter device in accordance with embodiments of the present disclosure.

FIG. 5A is a process flow diagram for link training for a width and frequency converter device in accordance with embodiments of the present disclosure. The WFC device can undergo link training. Specifically, at the outset, the link training can include training links connected to the WFC device at L0 for Gen 1 widths and frequency (502). The WFC device can determine widths and max data rates across the (pseudo) ports, including at least one UP and at least one DN on each link. If the width (w) of a first (pseudo) port (P1) is twice the width w of a second (pseudo) port (P2) ($W_{P1}=2W_{P2}$) and the max data rate of P1 (wider port) is half that of the max data rate of the P2 (the narrower port) ($2R_{P1}=R_{P2}$) (504), this indicates that the link uses the WFC device functionality. Otherwise, the WFC device can act as a retimer and complete equalization (506).

When the conditions (wP1=2wP2 and 2rP1=rP2) are met, then a determination can be made to bypass equalization (508). If it is elected to bypass equalization, then the link can enter recovery in Gen 1 and switch to the highest data rate in each (pseudo) port (510). If equalization is not to be bypassed, it can be determined whether to bypass equalization to highest data rate in each (pseudo) port (512). If the link is to bypass equalization to the highest data rate in each (pseudo) port, then the data rate is set to a highest data rate in the narrower (pseudo) port (e.g., Gen n data rate, where n is the generation associated with the narrower port and corresponding data rate) (522). The WFC device can then perform equalization at Gen n for the narrower (pseudo) port and at Gen (n−1) for the wider (pseudo) port (516). The value of n can be incremented (set n=n+1).

If equalization is not bypassed, then the WFC device can perform equalization at Gen n=3 for the narrower (pseudo) port while holding the wider (pseudo) port in Recovery—L0 without advertising the Gen 3 data rate; and can set n=4 (514). The WFC device can then perform equalization at Gen n for the narrower (pseudo) port and at Gen (n−1) for the wider (pseudo) port (516). The value of n can be incremented (set n=n+1).

After each increment for n, the process can continue to (516) until n is equal to the highest rate in the narrower port (518). Once n is equal to the highest rate in the narrower port, the WFC device is ready to operate in L0 in the highest data rate in each (pseudo) port (520).

Figure 5B:
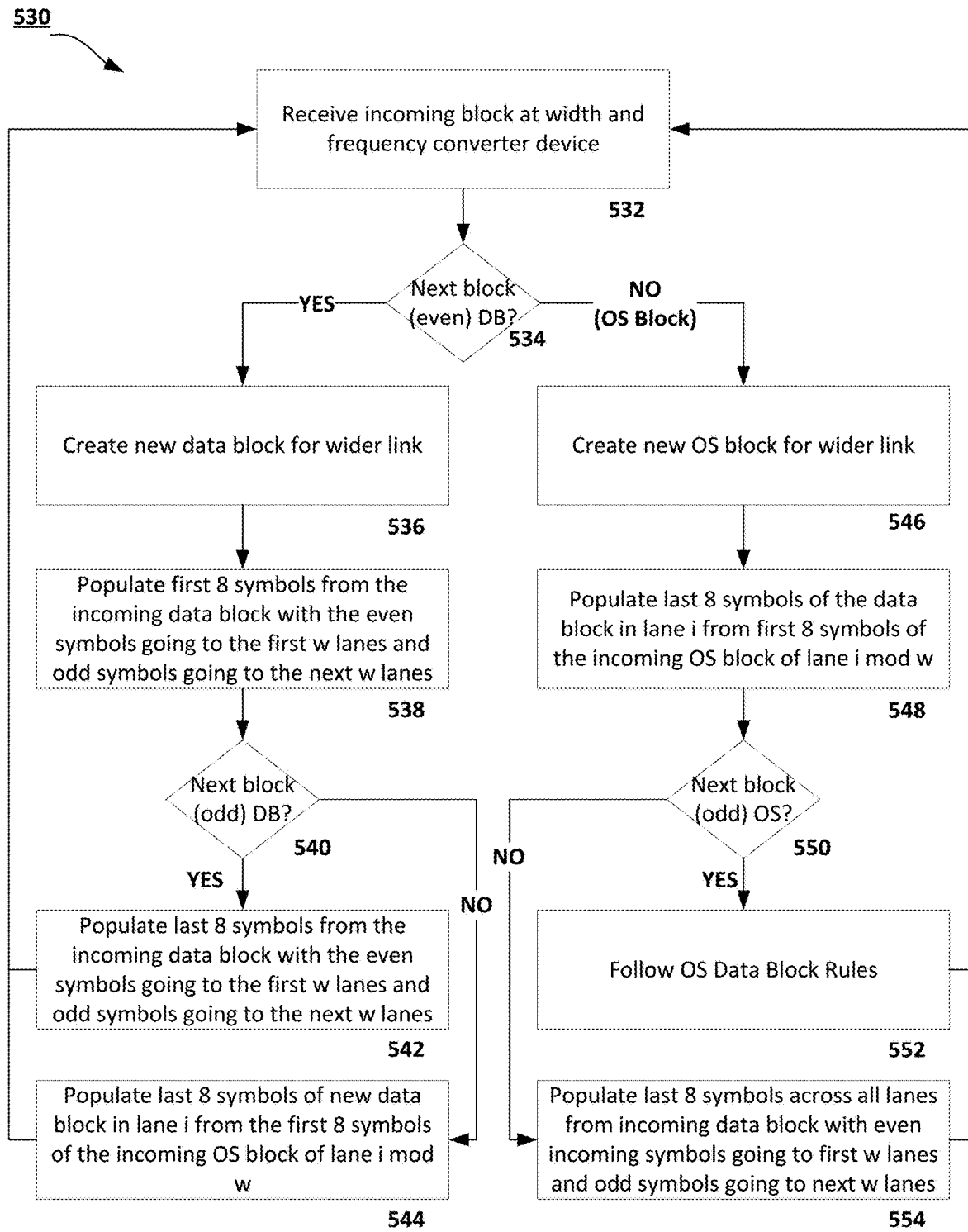
FIG. 5B is a process flow diagram for performing width and frequency conversion by a converter chip in accordance with embodiments of the present disclosure.

FIG. 5B is a process flow diagram for performing width and frequency conversion by a converter chip in accordance with embodiments of the present disclosure. In FIG. 5B, the assumed conditions are that the link is configured such that the block received travels from a narrower and faster link to a wider and slower link (e.g., Xw Gen n→x(2w) Gen (n−1), where w is width the link and n represent the protocol generation). An incoming block can be received by the WFC device (532). If the incoming block is an (even) data block (534), then the WFC device can create a new data block for the wider link (536). The WFC device can populate the first 8 symbols from the incoming data block, with the even symbols going to the first w lanes and the odd symbols going to the next w lanes (538). If the next block is an (odd) data block (540), then the WFC device can populate the last 8 symbols from the incoming data block, with the even symbols going to the first w lanes and odd symbols going to the next w lanes (542). If the next block received is not a data block, then the WFC device can populate the last 8 symbols of the new data block in lane i from the first 8 symbols of the incoming OS block of lane i mod w (544).

If the incoming block is not a data block (534) (i.e., the incoming block is an OS block), then the WFC device can create a new OS block for the wider link (546). The WFC device can populate the last 8 symbols of the data block in lane i from the first 8 symbols of the incoming OS block of lane i mod w (548). If the next block is an (odd) OS block (550), then the following OS block rules are applied according to the {first OS, 2nd OS} received (552):

{TS1, TS1}: Send TS1;
{TS1, SKP}: Send TS1 Block: First half TS1 and Second Half SKP w/ one SKP sent every two SKPs received (last 4 Symbols=>2 Symbols as SKP_END, filler Symbol);
{SKP, TS1}: Send SKP OS with length equal to half of what was received w/ proper SKP_END and parity bits;
{TS1, EIEOS}: Send TS1 followed by EIEOS, Ignore the next two OS;
{EIEOS, TS1}: Send EIEOS;
TS2'es permutation with SKP and EIEOS the same as TS1 above
{TS1, TS2}: Send TS1;
{TS2, SDS}: Send one OS Block—half TS2 and other half SDS.

If the next block is not an OS block (i.e., the next block is a data block) (550), then the WFC device can populate the last 8 symbols across all lanes from the incoming data block, with even incoming symbols going to the first w lanes and odd symbols going to the next w lanes (554).

Figures 1, 5C:
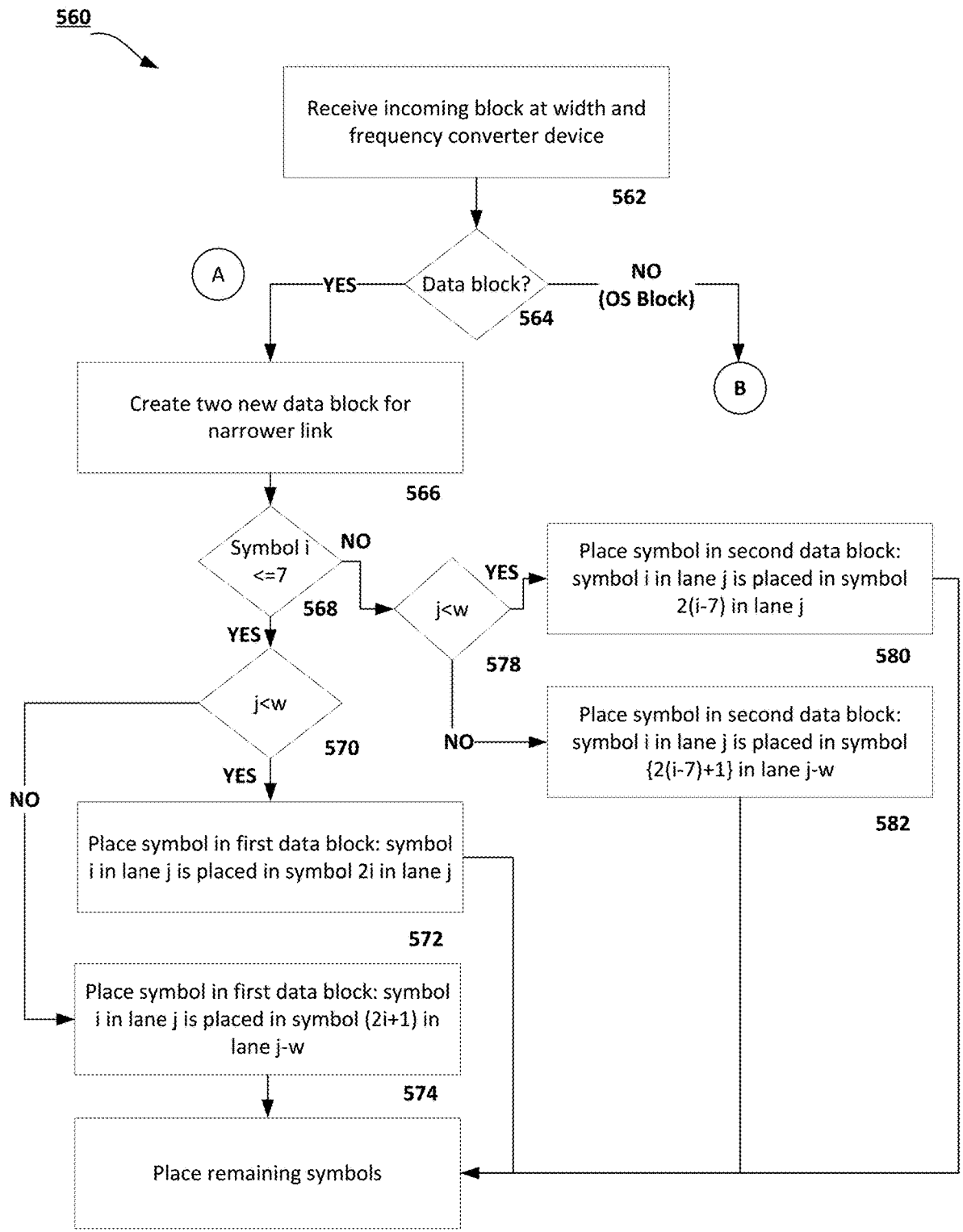
Figures 2, 5C:
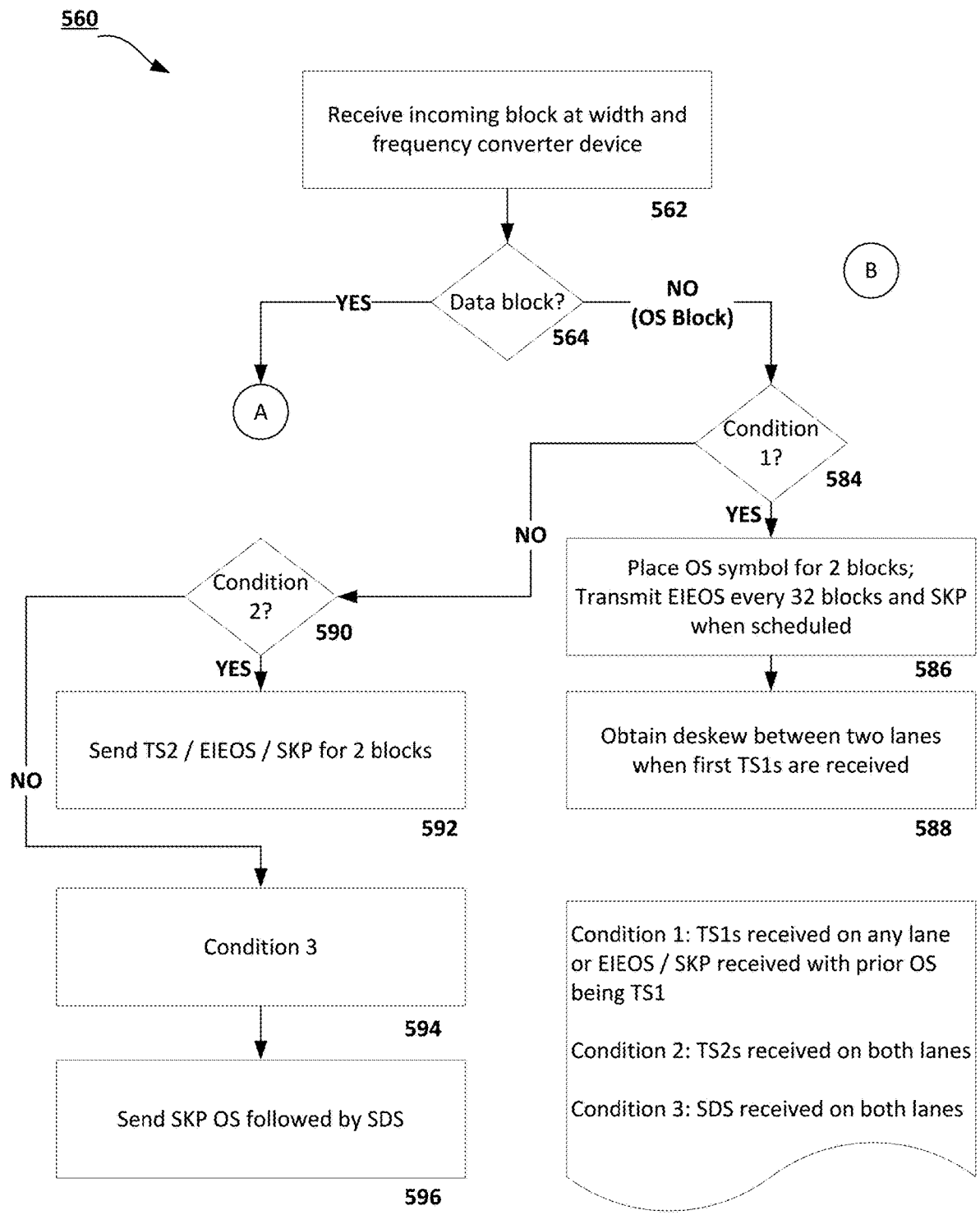

FIG. 5C1-5C2 are process flow diagrams for performing width and frequency conversion by a converter chip in accordance with embodiments of the present disclosure. In FIG. 5C, the assumed conditions are that the link is configured such that the block received travels from a wider and slower link to a narrower and faster link (e.g., X(2w) Gen (n−1)→Xw Gen n, where w is width the link and n represent the protocol generation). An incoming block can be received by the WFC device (562). If the incoming block is a data block (564), the WFC device can create two new data blocks for the narrower link (566). The symbols can be populated in the two new data blocks as follows:

If symbol i<=7 (568) and if j<w (570), then the WFC device can place symbol i from lane j of the incoming data block in symbol 2i in lane j of the first data block (572). The WFC device can then place the remaining symbols (576). If j>=w, then the WFC device can place symbol i in lane j of the incoming data block in symbol (2i+1) in lane j-w of the first data block (574). The WFC device can then place the remaining symbols (576).

If symbol i>7 (568), and j<w (578), then the WFC device can place symbol i from lane j from the incoming block into symbol 2(i−7) in lane j of the second data block (580). The WFC device can then place the remaining symbols (576). If symbol i>7 (568), and j>=w (578), then the WFC device can place symbol i from lane j from the incoming block into symbol {2(i−7)+1} in lane j-w of the second data block (582). The WFC device can then place the remaining symbols (576).

If the incoming block is not a data block (i.e., the block is an OS block) (564), then the type of OS can be used to determine next steps. If the OS block contains TS1s on any one of the two lanes or an EIEOS/SKP OS is received with a prior OS being a TS1 (584, Condition 1), then the WFC device can place OS symbols for 2 blocks and can, in some embodiments, transmit EIEOS every 32 blocks and SKP whenever the scheduled interval shows up (586). There is no need to match with whether EIEOS or SKP was received at that precise interval. The WFC device can obtain deskew between two lanes when the first TS1s are received (588), and can monitor for any bit slip/SKP and readjust.

If condition 1 is not met, but rather, TS2s are received on both lanes (590, Condition 2), then the WFC device can sent TS2/EIEOS/SKP for 2 blocks (592). The first EIEOS can be sent on a TS1→TS2 transition and an EIEOS sent ever 32 blocks. The SKIP can be sent when the interval is up or before sending a SDS. Otherwise, transmit TS2s on both blocks.

If condition 1 and condition 2 are not met, and an SDS is received on both lanes (594, Condition 3), then the WFC device can send a SKP OS followed by the SDS (596).

Any subsequent entry to Recovery and Config in the frequency/width mix follows the same rules as initial training. If due to speed change both ports are at the same data rate, the converter chip operates as a Retimer with identical width/speed between the UP and DN ports. If due to speed change both ports are at the same data rate, the converter chip operates as a Retimer with identical width/speed between the UP and DN ports.

One interconnect fabric architecture includes the Peripheral Component Interconnect (PCI) Express (PCIe) architecture. A primary goal of PCIe is to enable components and devices from different vendors to inter-operate in an open architecture, spanning multiple market segments; Clients (Desktops and Mobile), Servers (Standard and Enterprise), and Embedded and Communication devices. PCI Express is a high performance, general purpose I/O interconnect defined for a wide variety of future computing and communication platforms. Some PCI attributes, such as its usage model, load-store architecture, and software interfaces, have been maintained through its revisions, whereas previous parallel bus implementations have been replaced by a highly scalable, fully serial interface. The more recent versions of PCI Express take advantage of advances in point-to-point interconnects, Switch-based technology, and packetized protocol to deliver new levels of performance and features. Power Management, Quality Of Service (QoS), Hot-Plug/Hot-Swap support, Data Integrity, and Error Handling are among some of the advanced features supported by PCI Express.

Figure 6:
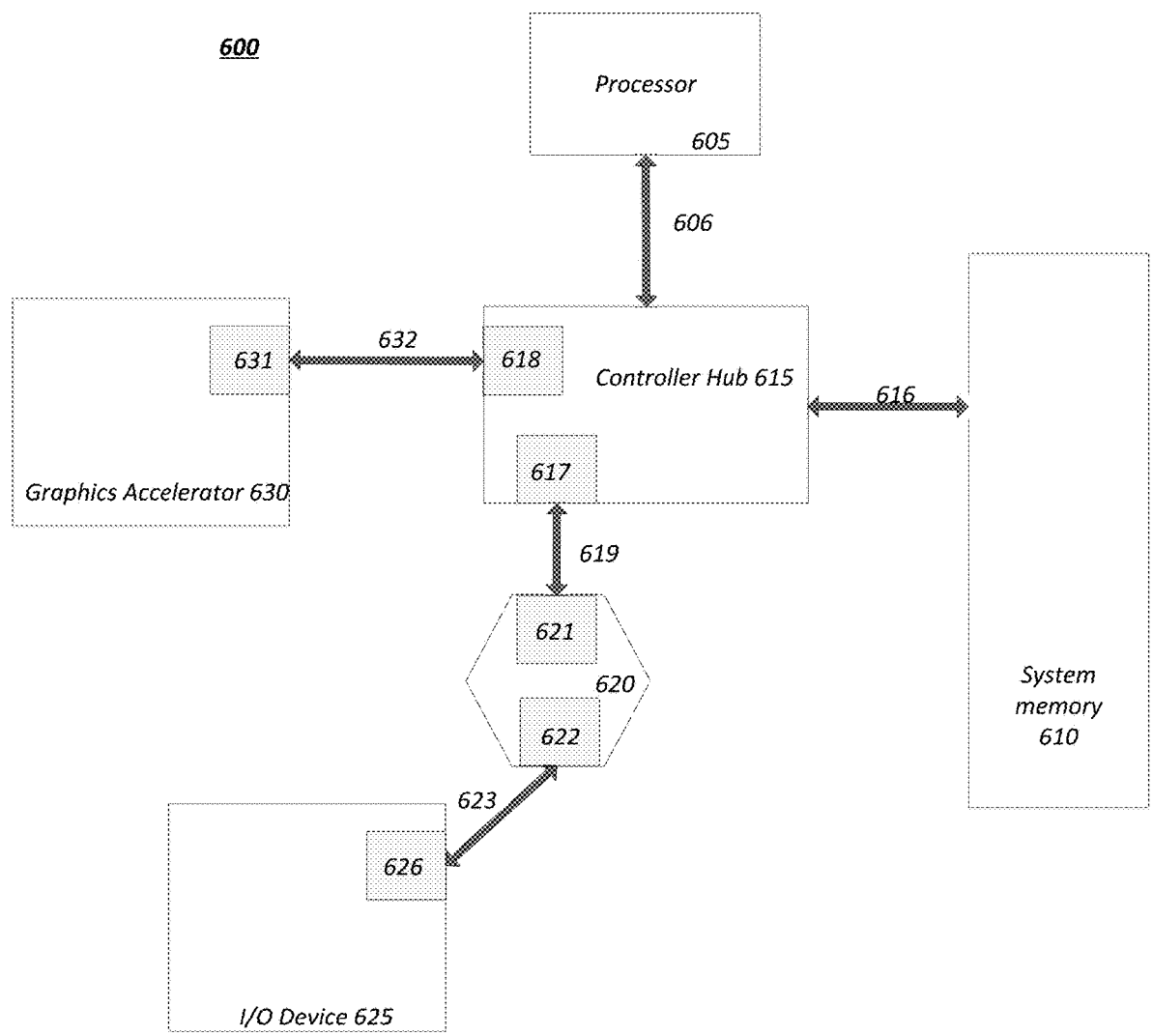
FIG. 6 illustrates an embodiment of a computing system including an interconnect architecture.

Referring to FIG. 6, an embodiment of a fabric composed of point-to-point Links that interconnect a set of components is illustrated. System 600 includes processor 605 and system memory 610 coupled to controller hub 615. Processor 605 includes any processing element, such as a microprocessor, a host processor, an embedded processor, a co-processor, or other processor. Processor 605 is coupled to controller hub 615 through front-side bus (FSB) 606. In one embodiment, FSB 606 is a serial point-to-point interconnect as described below. In another embodiment, link 606 includes a serial, differential interconnect architecture that is compliant with different interconnect standard.

System memory 610 includes any memory device, such as random access memory (RAM), non-volatile (NV) memory, or other memory accessible by devices in system 600. System memory 610 is coupled to controller hub 615 through memory interface 616. Examples of a memory interface include a double-data rate (DDR) memory interface, a dual-channel DDR memory interface, and a dynamic RAM (DRAM) memory interface.

In one embodiment, controller hub 615 is a root hub, root complex, or root controller in a Peripheral Component Interconnect Express (PCIe or PCIE) interconnection hierarchy. Examples of controller hub 615 include a chipset, a memory controller hub (MCH), a northbridge, an interconnect controller hub (ICH) a southbridge, and a root port controller/hub. Often the term chipset refers to two physically separate controller hubs, i.e. a memory controller hub (MCH) coupled to an interconnect controller hub (ICH). Note that current systems often include the MCH integrated with processor 605, while controller 615 is to communicate with I/O devices, in a similar manner as described below. In some embodiments, peer-to-peer routing is optionally supported through root complex 615.

Here, controller hub 615 is coupled to switch/bridge 620 through serial link 619. Input/output modules 617 and 621, which may also be referred to as interfaces/ports 617 and 621, include/implement a layered protocol stack to provide communication between controller hub 615 and switch 620. In one embodiment, multiple devices are capable of being coupled to switch 620.

Switch/bridge 620 routes packets/messages from device 625 upstream, i.e. up a hierarchy towards a root complex, to controller hub 615 and downstream, i.e. down a hierarchy away from a root port controller, from processor 605 or system memory 610 to device 625. Switch 620, in one embodiment, is referred to as a logical assembly of multiple virtual PCI-to-PCI bridge devices. Device 625 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Firewire device, a Universal Serial Bus (USB) device, a scanner, and other input/output devices. Often in the PCIe vernacular, such as device, is referred to as an endpoint. Although not specifically shown, device 625 may include a PCIe to PCI/PCI-X bridge to support legacy or other version PCI devices. Endpoint devices in PCIe are often classified as legacy, PCIe, or root complex integrated endpoints.

Graphics accelerator 630 is also coupled to controller hub 615 through serial link 632. In one embodiment, graphics accelerator 630 is coupled to an MCH, which is coupled to an ICH. Switch 620, and accordingly I/O device 625, is then coupled to the ICH. I/O modules 631 and 618 are also to implement a layered protocol stack to communicate between graphics accelerator 630 and controller hub 615. Similar to the MCH discussion above, a graphics controller or the graphics accelerator 630 itself may be integrated in processor 605.

Figure 7:
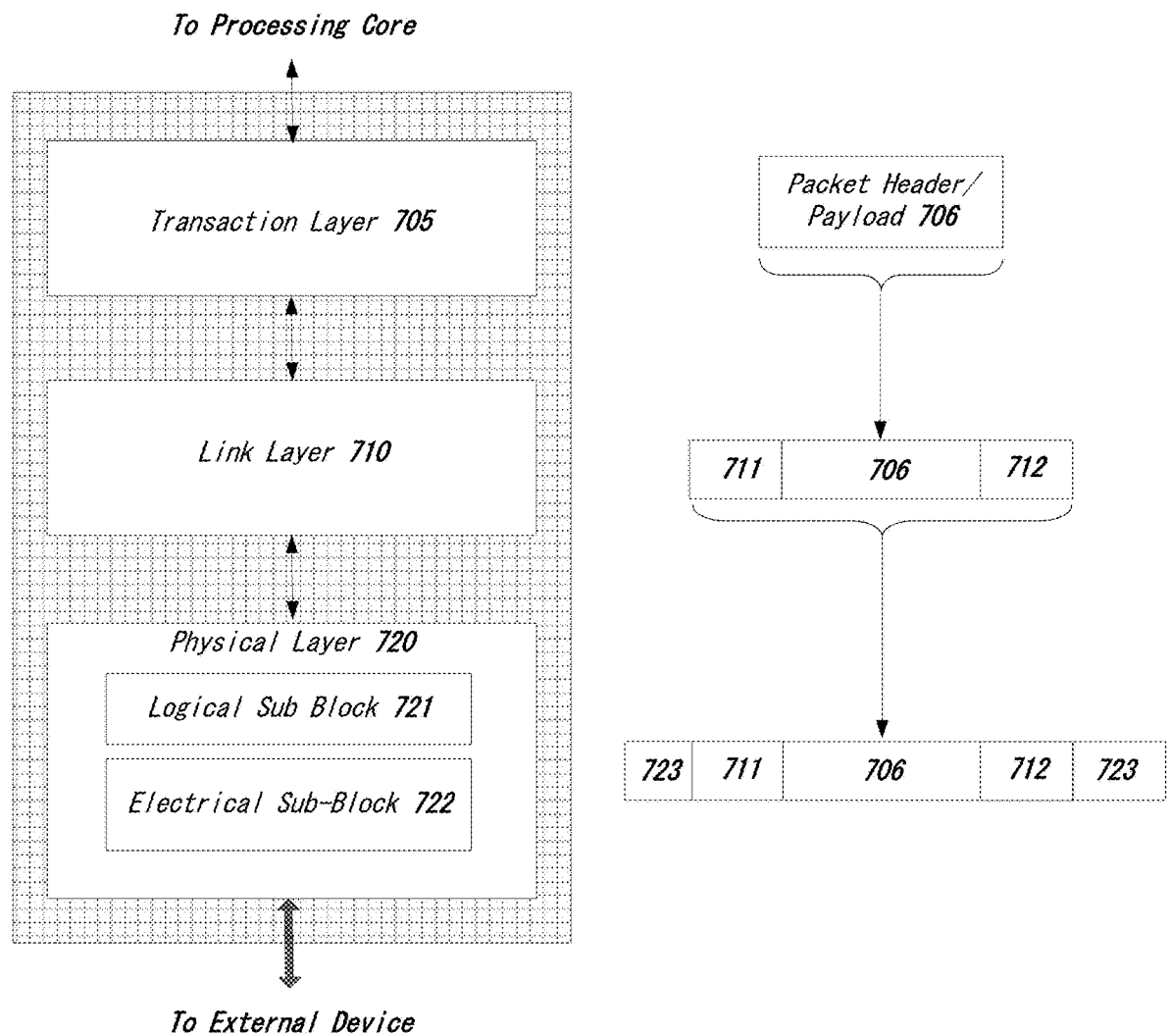
FIG. 7 illustrates an embodiment of an interconnect architecture including a layered stack.

Turning to FIG. 7 an embodiment of a layered protocol stack is illustrated. Layered protocol stack 700 includes any form of a layered communication stack, such as a Quick Path Interconnect (QPI) stack, a PCIe stack, a next generation high performance computing interconnect stack, or other layered stack. Although the discussion immediately below in reference to FIGS. 6-9 are in relation to a PCIe stack, the same concepts may be applied to other interconnect stacks. In one embodiment, protocol stack 700 is a PCIe protocol stack including transaction layer 705, link layer 710, and physical layer 720. An interface, such as interfaces 617, 618, 621, 622, 626, and 631 in FIG. 1, may be represented as communication protocol stack 700. Representation as a communication protocol stack may also be referred to as a module or interface implementing/including a protocol stack.

PCI Express uses packets to communicate information between components. Packets are formed in the Transaction Layer 705 and Data Link Layer 710 to carry the information from the transmitting component to the receiving component. As the transmitted packets flow through the other layers, they are extended with additional information necessary to handle packets at those layers. At the receiving side the reverse process occurs and packets get transformed from their Physical Layer 720 representation to the Data Link Layer 710 representation and finally (for Transaction Layer Packets) to the form that can be processed by the Transaction Layer 705 of the receiving device.

Transaction Layer

In one embodiment, transaction layer 705 is to provide an interface between a device's processing core and the interconnect architecture, such as data link layer 710 and physical layer 720. In this regard, a primary responsibility of the transaction layer 705 is the assembly and disassembly of packets (i.e., transaction layer packets, or TLPs). The translation layer 705 typically manages credit-base flow control for TLPs. PCIe implements split transactions, i.e. transactions with request and response separated by time, allowing a link to carry other traffic while the target device gathers data for the response.

In addition PCIe utilizes credit-based flow control. In this scheme, a device advertises an initial amount of credit for each of the receive buffers in Transaction Layer 705. An external device at the opposite end of the link, such as controller hub 115 in FIG. 1, counts the number of credits consumed by each TLP. A transaction may be transmitted if the transaction does not exceed a credit limit. Upon receiving a response an amount of credit is restored. An advantage of a credit scheme is that the latency of credit return does not affect performance, provided that the credit limit is not encountered.

In one embodiment, four transaction address spaces include a configuration address space, a memory address space, an input/output address space, and a message address space. Memory space transactions include one or more of read requests and write requests to transfer data to/from a memory-mapped location. In one embodiment, memory space transactions are capable of using two different address formats, e.g., a short address format, such as a 32-bit address, or a long address format, such as 64-bit address. Configuration space transactions are used to access configuration space of the PCIe devices. Transactions to the configuration space include read requests and write requests. Message space transactions (or, simply messages) are defined to support in-band communication between PCIe agents.

Therefore, in one embodiment, transaction layer 705 assembles packet header/payload 706. Format for current packet headers/payloads may be found in the PCIe specification at the PCIe specification website.

Figure 8:
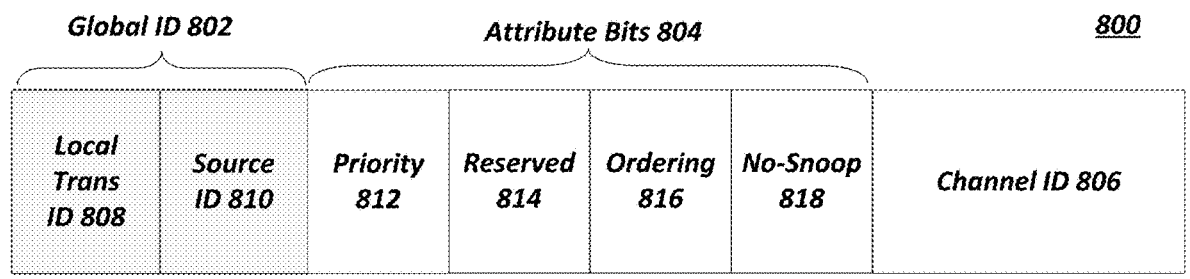
FIG. 8 illustrates an embodiment of a request or packet to be generated or received within an interconnect architecture.

Quickly referring to FIG. 8, an embodiment of a PCIe transaction descriptor is illustrated. In one embodiment, transaction descriptor 800 is a mechanism for carrying transaction information. In this regard, transaction descriptor 800 supports identification of transactions in a system. Other potential uses include tracking modifications of default transaction ordering and association of transaction with channels.

Transaction descriptor 800 includes global identifier field 802, attributes field 804, and channel identifier field 806. In the illustrated example, global identifier field 802 is depicted comprising local transaction identifier field 808 and source identifier field 810. In one embodiment, global transaction identifier 802 is unique for all outstanding requests.

According to one implementation, local transaction identifier field 808 is a field generated by a requesting agent, and it is unique for all outstanding requests that require a completion for that requesting agent. Furthermore, in this example, source identifier 810 uniquely identifies the requestor agent within a PCIe hierarchy. Accordingly, together with source ID 810, local transaction identifier 808 field provides global identification of a transaction within a hierarchy domain.

Attributes field 804 specifies characteristics and relationships of the transaction. In this regard, attributes field 804 is potentially used to provide additional information that allows modification of the default handling of transactions. In one embodiment, attributes field 804 includes priority field 812, reserved field 814, ordering field 816, and no-snoop field 818. Here, priority sub-field 812 may be modified by an initiator to assign a priority to the transaction. Reserved attribute field 814 is left reserved for future, or vendor-defined usage. Possible usage models using priority or security attributes may be implemented using the reserved attribute field.

In this example, ordering attribute field 816 is used to supply optional information conveying the type of ordering that may modify default ordering rules. According to one example implementation, an ordering attribute of "0" denotes default ordering rules are to apply, wherein an ordering attribute of "1" denotes relaxed ordering, wherein writes can pass writes in the same direction, and read completions can pass writes in the same direction. Snoop attribute field 818 is utilized to determine if transactions are snooped. As shown, channel ID Field 806 identifies a channel that a transaction is associated with.

Link Layer

Link layer 710, also referred to as data link layer 710, acts as an intermediate stage between transaction layer 705 and the physical layer 720. In one embodiment, a responsibility of the data link layer 710 is providing a reliable mechanism for exchanging Transaction Layer Packets (TLPs) between two components a link. One side of the Data Link Layer 710 accepts TLPs assembled by the Transaction Layer 705, applies packet sequence identifier 711, i.e. an identification number or packet number, calculates and applies an error detection code, i.e. CRC 712, and submits the modified TLPs to the Physical Layer 720 for transmission across a physical to an external device.

Physical Layer

In one embodiment, physical layer 720 includes logical sub block 721 and electrical sub-block 722 to physically transmit a packet to an external device. Here, logical sub-block 721 is responsible for the "digital" functions of Physical Layer 721. In this regard, the logical sub-block includes a transmit section to prepare outgoing information for transmission by physical sub-block 722, and a receiver section to identify and prepare received information before passing it to the Link Layer 710.

Physical block 722 includes a transmitter and a receiver. The transmitter is supplied by logical sub-block 721 with symbols, which the transmitter serializes and transmits onto to an external device. The receiver is supplied with serialized symbols from an external device and transforms the received signals into a bit-stream. The bit-stream is de-serialized and supplied to logical sub-block 721. In one embodiment, an 8b/10b transmission code is employed, where ten-bit symbols are transmitted/received. Here, special symbols are used to frame a packet with frames 723. In addition, in one example, the receiver also provides a symbol clock recovered from the incoming serial stream.

As stated above, although transaction layer 705, link layer 710, and physical layer 720 are discussed in reference to a specific embodiment of a PCIe protocol stack, a layered protocol stack is not so limited. In fact, any layered protocol may be included/implemented. As an example, an port/interface that is represented as a layered protocol includes: (1) a first layer to assemble packets, i.e. a transaction layer; a second layer to sequence packets, i.e. a link layer; and a third layer to transmit the packets, i.e. a physical layer. As a specific example, a common standard interface (CSI) layered protocol is utilized.

Figure 9:
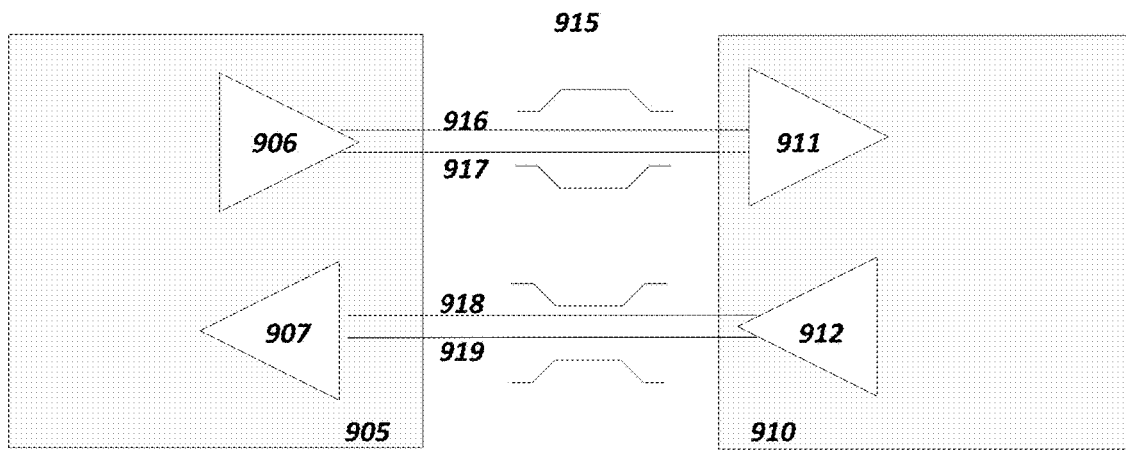
FIG. 9 illustrates an embodiment of a transmitter and receiver pair for an interconnect architecture.

Referring next to FIG. 9, an embodiment of a PCIe serial point to point fabric is illustrated. Although an embodiment of a PCIe serial point-to-point link is illustrated, a serial point-to-point link is not so limited, as it includes any transmission path for transmitting serial data. In the embodiment shown, a basic PCIe link includes two, low-voltage, differentially driven signal pairs: a transmit pair 906/911 and a receive pair 912/907. Accordingly, device 905 includes transmission logic 906 to transmit data to device 910 and receiving logic 907 to receive data from device 910. In other words, two transmitting paths, i.e. paths 916 and 917, and two receiving paths, i.e. paths 918 and 919, are included in a PCIe link.

A transmission path refers to any path for transmitting data, such as a transmission line, a copper line, an optical line, a wireless communication channel, an infrared communication link, or other communication path. A connection between two devices, such as device 905 and device 910, is referred to as a link, such as link 415. A link may support one lane—each lane representing a set of differential signal pairs (one pair for transmission, one pair for reception). To scale bandwidth, a link may aggregate multiple lanes denoted by xN, where N is any supported Link width, such as 1, 2, 4, 8, 12, 16, 32, 64, or wider.

A differential pair refers to two transmission paths, such as lines 416 and 417, to transmit differential signals. As an example, when line 416 toggles from a low voltage level to a high voltage level, i.e. a rising edge, line 417 drives from a high logic level to a low logic level, i.e. a falling edge. Differential signals potentially demonstrate better electrical characteristics, such as better signal integrity, i.e. cross-coupling, voltage overshoot/undershoot, ringing, etc. This allows for better timing window, which enables faster transmission frequencies.

Note that the apparatus, methods, and systems described above may be implemented in any electronic device or system as aforementioned. As specific illustrations, the figures below provide exemplary systems for utilizing the disclosure as described herein. As the systems below are described in more detail, a number of different interconnects are disclosed, described, and revisited from the discussion above. And as is readily apparent, the advances described above may be applied to any of those interconnects, fabrics, or architectures.

Figure 10:
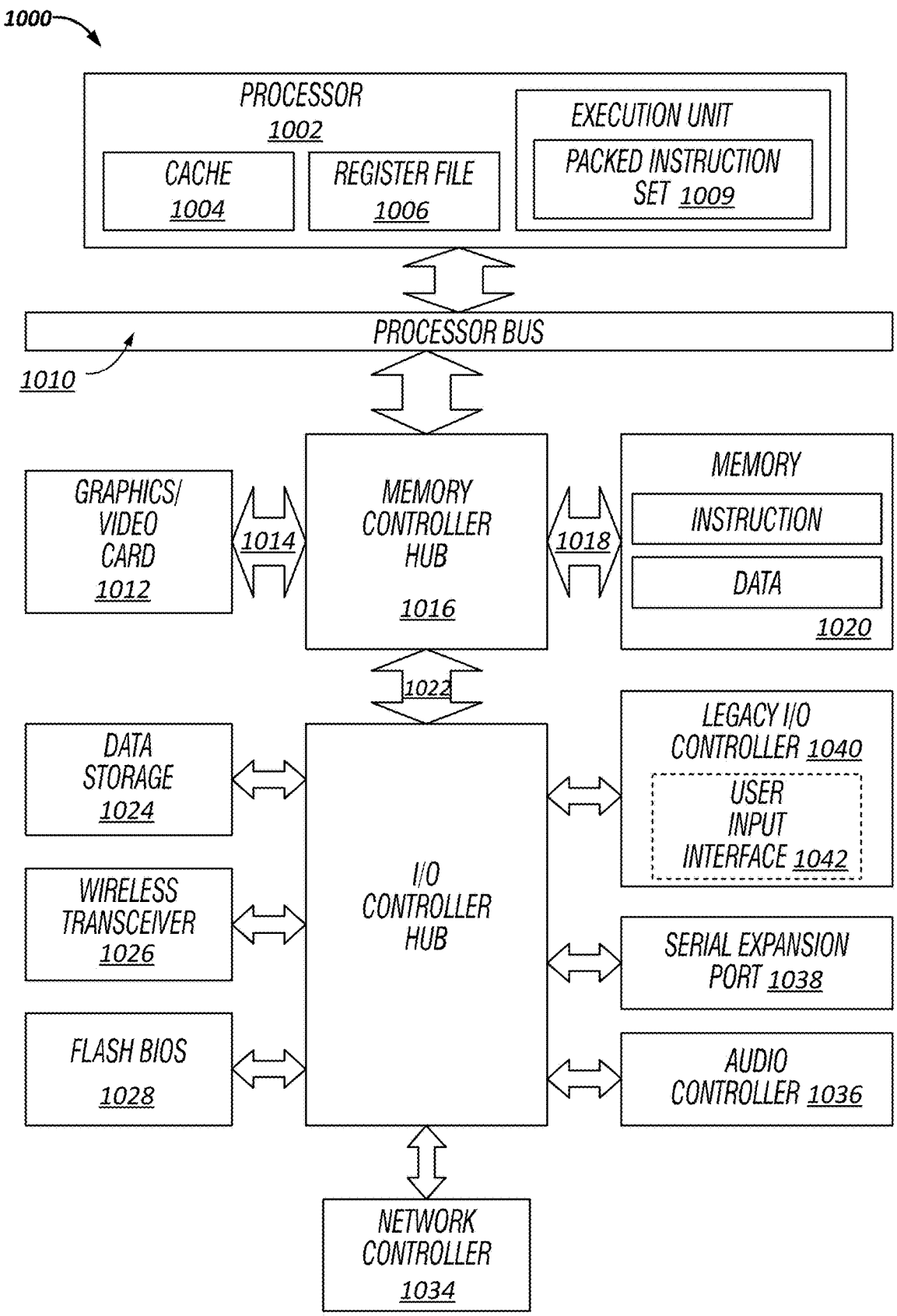
FIG. 10 illustrates another embodiment of a block diagram for a computing system including a processor.

Turning to FIG. 10, a block diagram of an exemplary computer system formed with a processor that includes execution units to execute an instruction, where one or more of the interconnects implement one or more features in accordance with one embodiment of the present disclosure is illustrated. System 1000 includes a component, such as a processor 1002 to employ execution units including logic to perform algorithms for process data, in accordance with the present disclosure, such as in the embodiment described herein. System 1000 is representative of processing systems based on the PENTIUM III™, PENTIUM 4™, Xeon™, Itanium, XScale™ and/or StrongARM™ microprocessors available from Intel Corporation of Santa Clara, Calif., although other systems (including PCs having other microprocessors, engineering workstations, set-top boxes and the like) may also be used. In one embodiment, sample system 1000 executes a version of the WINDOWS™ operating system available from Microsoft Corporation of Redmond, Wash., although other operating systems (UNIX and Linux for example), embedded software, and/or graphical user interfaces, may also be used. Thus, embodiments of the present disclosure are not limited to any specific combination of hardware circuitry and software.

Embodiments are not limited to computer systems. Alternative embodiments of the present disclosure can be used in other devices such as handheld devices and embedded applications. Some examples of handheld devices include cellular phones, Internet Protocol devices, digital cameras, personal digital assistants (PDAs), and handheld PCs. Embedded applications can include a micro controller, a digital signal processor (DSP), system on a chip, network computers (NetPC), set-top boxes, network hubs, wide area network (WAN) switches, or any other system that can perform one or more instructions in accordance with at least one embodiment.

In this illustrated embodiment, processor 1002 includes one or more execution units 1008 to implement an algorithm that is to perform at least one instruction. One embodiment may be described in the context of a single processor desktop or server system, but alternative embodiments may be included in a multiprocessor system. System 1000 is an example of a 'hub' system architecture. The computer system 1000 includes a processor 1002 to process data signals. The processor 1002, as one illustrative example, includes a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. The processor 1002 is coupled to a processor bus 1010 that transmits data signals between the processor 1002 and other components in the system 1000. The elements of system 1000 (e.g. graphics accelerator 1012, memory controller hub 1016, memory 1020, I/O controller hub 1024, wireless transceiver 1026, Flash BIOS 1028, Network controller 1034, Audio controller 1036, Serial expansion port 1038, I/O controller 1040, etc.) perform their conventional functions that are well known to those familiar with the art.

In one embodiment, the processor 1002 includes a Level 1 (L1) internal cache memory 1004. Depending on the architecture, the processor 1002 may have a single internal cache or multiple levels of internal caches. Other embodiments include a combination of both internal and external caches depending on the particular implementation and needs. Register file 1006 is to store different types of data in various registers including integer registers, floating point registers, vector registers, banked registers, shadow registers, checkpoint registers, status registers, and instruction pointer register.

Execution unit 1008, including logic to perform integer and floating point operations, also resides in the processor 1002. The processor 1002, in one embodiment, includes a microcode (ucode) ROM to store microcode, which when executed, is to perform algorithms for certain macroinstructions or handle complex scenarios. Here, microcode is potentially updateable to handle logic bugs/fixes for processor 1002. For one embodiment, execution unit 1008 includes logic to handle a packed instruction set 1009. By including the packed instruction set 1009 in the instruction set of a general-purpose processor 1002, along with associated circuitry to execute the instructions, the operations used by many multimedia applications may be performed using packed data in a general-purpose processor 1002. Thus, many multimedia applications are accelerated and executed more efficiently by using the full width of a processor's data bus for performing operations on packed data. This potentially eliminates the need to transfer smaller units of data across the processor's data bus to perform one or more operations, one data element at a time.

Alternate embodiments of an execution unit 1008 may also be used in micro controllers, embedded processors, graphics devices, DSPs, and other types of logic circuits. System 1000 includes a memory 1020. Memory 1020 includes a dynamic random access memory (DRAM) device, a static random access memory (SRAM) device, flash memory device, or other memory device. Memory 1020 stores instructions and/or data represented by data signals that are to be executed by the processor 1002.

Note that any of the aforementioned features or aspects of the disclosure may be utilized on one or more interconnect illustrated in FIG. 10. For example, an on-die interconnect (ODI), which is not shown, for coupling internal units of processor 1002 implements one or more aspects of the disclosure described above. Or the disclosure is associated with a processor bus 1010 (e.g. Intel Quick Path Interconnect (QPI) or other known high performance computing interconnect), a high bandwidth memory path 1018 to memory 1020, a point-to-point link to graphics accelerator 1012 (e.g. a Peripheral Component Interconnect express (PCIe) compliant fabric), a controller hub interconnect 1022, an I/O or other interconnect (e.g. USB, PCI, PCIe) for coupling the other illustrated components. Some examples of such components include the audio controller 1036, firmware hub (flash BIOS) 1028, wireless transceiver 1026, data storage 1024, legacy I/O controller 1010 containing user input and keyboard interfaces 1042, a serial expansion port 1038 such as Universal Serial Bus (USB), and a network controller 1034. The data storage device 1024 can comprise a hard disk drive, a floppy disk drive, a CD-ROM device, a flash memory device, or other mass storage device.

Figure 11:
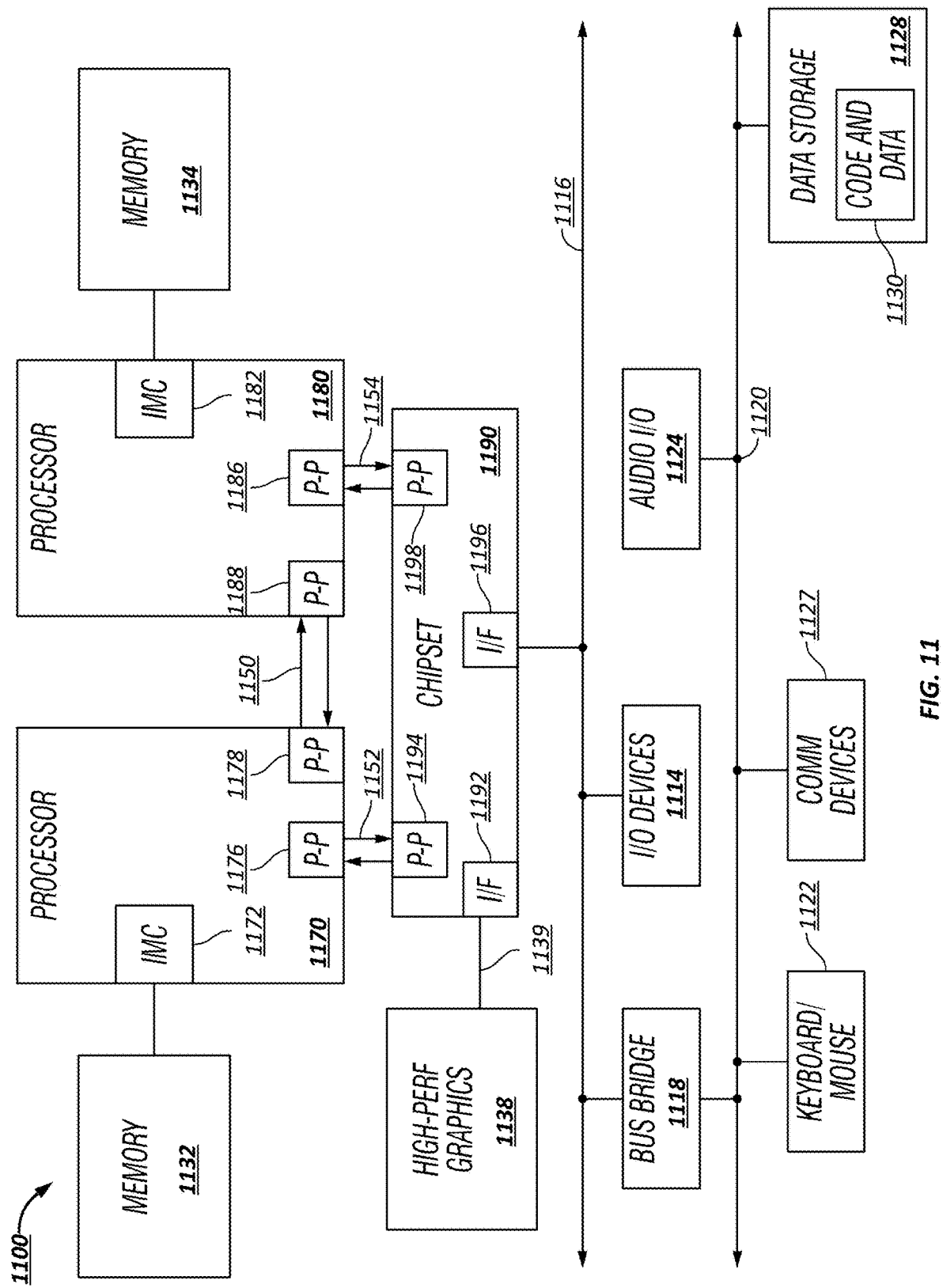
FIG. 11 illustrates an embodiment of a block for a computing system including multiple processor sockets.

Referring now to FIG. 11, shown is a block diagram of a second system 1100 in accordance with an embodiment of the present disclosure. As shown in FIG. 11, multiprocessor system 1100 is a point-to-point interconnect system, and includes a first processor 1170 and a second processor 1180 coupled via a point-to-point interconnect 1150. Each of processors 1170 and 1180 may be some version of a processor. In one embodiment, 1152 and 1154 are part of a serial, point-to-point coherent interconnect fabric, such as Intel's Quick Path Interconnect (QPI) architecture. As a result, the disclosure may be implemented within the QPI architecture.

While shown with only two processors 1170, 1180, it is to be understood that the scope of the present disclosure is not so limited. In other embodiments, one or more additional processors may be present in a given processor.

Processors 1170 and 1180 are shown including integrated memory controller units 1172 and 1182, respectively. Processor 1170 also includes as part of its bus controller units point-to-point (P-P) interfaces 1176 and 1178; similarly, second processor 1180 includes P-P interfaces 1186 and 1188. Processors 1170, 1180 may exchange information via a point-to-point (P-P) interface 1150 using P-P interface circuits 1178, 1188. As shown in FIG. 11, IMCs 1172 and 1182 couple the processors to respective memories, namely a memory 1132 and a memory 1134, which may be portions of main memory locally attached to the respective processors.

Processors 1170, 1180 each exchange information with a chipset 1190 via individual P-P interfaces 1152, 1154 using point to point interface circuits 1176, 1194, 1186, 1198. Chipset 1190 also exchanges information with a high-performance graphics circuit 1138 via an interface circuit 1192 along a high-performance graphics interconnect 1139.

A shared cache (not shown) may be included in either processor or outside of both processors; yet connected with the processors via P-P interconnect, such that either or both processors' local cache information may be stored in the shared cache if a processor is placed into a low power mode.

Chipset 1190 may be coupled to a first bus 1116 via an interface 1196. In one embodiment, first bus 1116 may be a Peripheral Component Interconnect (PCI) bus, or a bus such as a PCI Express bus or another third generation I/O interconnect bus, although the scope of the present disclosure is not so limited.

As shown in FIG. 11, various I/O devices 1114 are coupled to first bus 1116, along with a bus bridge 1118 which couples first bus 1116 to a second bus 1120. In one embodiment, second bus 1120 includes a low pin count (LPC) bus. Various devices are coupled to second bus 1120 including, for example, a keyboard and/or mouse 1122, communication devices 1127 and a storage unit 1128 such as a disk drive or other mass storage device which often includes instructions/code and data 1130, in one embodiment. Further, an audio I/O 1124 is shown coupled to second bus 1120. Note that other architectures are possible, where the included components and interconnect architectures vary. For example, instead of the point-to-point architecture of FIG. 11, a system may implement a multi-drop bus or other such architecture.

Using the various inertial and environmental sensors present in a platform, many different use cases may be realized. These use cases enable advanced computing operations including perceptual computing and also allow for enhancements with regard to power management/battery life, security, and system responsiveness.

For example with regard to power management/battery life issues, based at least on part on information from an ambient light sensor, the ambient light conditions in a location of the platform are determined and intensity of the display controlled accordingly. Thus, power consumed in operating the display is reduced in certain light conditions.

As to security operations, based on context information obtained from the sensors such as location information, it may be determined whether a user is allowed to access certain secure documents. For example, a user may be permitted to access such documents at a work place or a home location. However, the user is prevented from accessing such documents when the platform is present at a public location. This determination, in one embodiment, is based on location information, e.g., determined via a GPS sensor or camera recognition of landmarks. Other security operations may include providing for pairing of devices within a close range of each other, e.g., a portable platform as described herein and a user's desktop computer, mobile telephone or so forth. Certain sharing, in some implementations, are realized via near field communication when these devices are so paired. However, when the devices exceed a certain range, such sharing may be disabled. Furthermore, when pairing a platform as described herein and a smartphone, an alarm may be configured to be triggered when the devices move more than a predetermined distance from each other, when in a public location. In contrast, when these paired devices are in a safe location, e.g., a work place or home location, the devices may exceed this predetermined limit without triggering such alarm.

Responsiveness may also be enhanced using the sensor information. For example, even when a platform is in a low power state, the sensors may still be enabled to run at a relatively low frequency. Accordingly, any changes in a location of the platform, e.g., as determined by inertial sensors, GPS sensor, or so forth is determined. If no such changes have been registered, a faster connection to a previous wireless hub such as a Wi-Fi™ access point or similar wireless enabler occurs, as there is no need to scan for available wireless network resources in this case. Thus, a greater level of responsiveness when waking from a low power state is achieved.

It is to be understood that many other use cases may be enabled using sensor information obtained via the integrated sensors within a platform as described herein, and the above examples are only for purposes of illustration. Using a system as described herein, a perceptual computing system may allow for the addition of alternative input modalities, including gesture recognition, and enable the system to sense user operations and intent.

In some embodiments one or more infrared or other heat sensing elements, or any other element for sensing the presence or movement of a user may be present. Such sensing elements may include multiple different elements working together, working in sequence, or both. For example, sensing elements include elements that provide initial sensing, such as light or sound projection, followed by sensing for gesture detection by, for example, an ultrasonic time of flight camera or a patterned light camera.

Also in some embodiments, the system includes a light generator to produce an illuminated line. In some embodiments, this line provides a visual cue regarding a virtual boundary, namely an imaginary or virtual location in space, where action of the user to pass or break through the virtual boundary or plane is interpreted as an intent to engage with the computing system. In some embodiments, the illuminated line may change colors as the computing system transitions into different states with regard to the user. The illuminated line may be used to provide a visual cue for the user of a virtual boundary in space, and may be used by the system to determine transitions in state of the computer with regard to the user, including determining when the user wishes to engage with the computer.

In some embodiments, the computer senses user position and operates to interpret the movement of a hand of the user through the virtual boundary as a gesture indicating an intention of the user to engage with the computer. In some embodiments, upon the user passing through the virtual line or plane the light generated by the light generator may change, thereby providing visual feedback to the user that the user has entered an area for providing gestures to provide input to the computer.

Display screens may provide visual indications of transitions of state of the computing system with regard to a user. In some embodiments, a first screen is provided in a first state in which the presence of a user is sensed by the system, such as through use of one or more of the sensing elements.

In some implementations, the system acts to sense user identity, such as by facial recognition. Here, transition to a second screen may be provided in a second state, in which the computing system has recognized the user identity, where this second the screen provides visual feedback to the user that the user has transitioned into a new state. Transition to a third screen may occur in a third state in which the user has confirmed recognition of the user.

In some embodiments, the computing system may use a transition mechanism to determine a location of a virtual boundary for a user, where the location of the virtual boundary may vary with user and context. The computing system may generate a light, such as an illuminated line, to indicate the virtual boundary for engaging with the system. In some embodiments, the computing system may be in a waiting state, and the light may be produced in a first color. The computing system may detect whether the user has reached past the virtual boundary, such as by sensing the presence and movement of the user using sensing elements.

In some embodiments, if the user has been detected as having crossed the virtual boundary (such as the hands of the user being closer to the computing system than the virtual boundary line), the computing system may transition to a state for receiving gesture inputs from the user, where a mechanism to indicate the transition may include the light indicating the virtual boundary changing to a second color.

In some embodiments, the computing system may then determine whether gesture movement is detected. If gesture movement is detected, the computing system may proceed with a gesture recognition process, which may include the use of data from a gesture data library, which may reside in memory in the computing device or may be otherwise accessed by the computing device.

If a gesture of the user is recognized, the computing system may perform a function in response to the input, and return to receive additional gestures if the user is within the virtual boundary. In some embodiments, if the gesture is not recognized, the computing system may transition into an error state, where a mechanism to indicate the error state may include the light indicating the virtual boundary changing to a third color, with the system returning to receive additional gestures if the user is within the virtual boundary for engaging with the computing system.

As mentioned above, in other embodiments the system can be configured as a convertible tablet system that can be used in at least two different modes, a tablet mode and a notebook mode. The convertible system may have two panels, namely a display panel and a base panel such that in the tablet mode the two panels are disposed in a stack on top of one another. In the tablet mode, the display panel faces outwardly and may provide touch screen functionality as found in conventional tablets. In the notebook mode, the two panels may be arranged in an open clamshell configuration.

In various embodiments, the accelerometer may be a 3-axis accelerometer having data rates of at least 50 Hz. A gyroscope may also be included, which can be a 3-axis gyroscope. In addition, an e-compass/magnetometer may be present. Also, one or more proximity sensors may be provided (e.g., for lid open to sense when a person is in proximity (or not) to the system and adjust power/performance to extend battery life). For some OS's Sensor Fusion capability including the accelerometer, gyroscope, and compass may provide enhanced features. In addition, via a sensor hub having a real-time clock (RTC), a wake from sensors mechanism may be realized to receive sensor input when a remainder of the system is in a low power state.

In some embodiments, an internal lid/display open switch or sensor to indicate when the lid is closed/open, and can be used to place the system into Connected Standby or automatically wake from Connected Standby state. Other system sensors can include ACPI sensors for internal processor, memory, and skin temperature monitoring to enable changes to processor and system operating states based on sensed parameters.

In an embodiment, the OS may be a Microsoft® Windows® 8 OS that implements Connected Standby (also referred to herein as Win8 CS). Windows 8 Connected Standby or another OS having a similar state can provide, via a platform as described herein, very low ultra idle power to enable applications to remain connected, e.g., to a cloud-based location, at very low power consumption. The platform can supports 3 power states, namely screen on (normal); Connected Standby (as a default "off" state); and shutdown (zero watts of power consumption). Thus in the Connected Standby state, the platform is logically on (at minimal power levels) even though the screen is off. In such a platform, power management can be made to be transparent to applications and maintain constant connectivity, in part due to offload technology to enable the lowest powered component to perform an operation.

Figure 12:
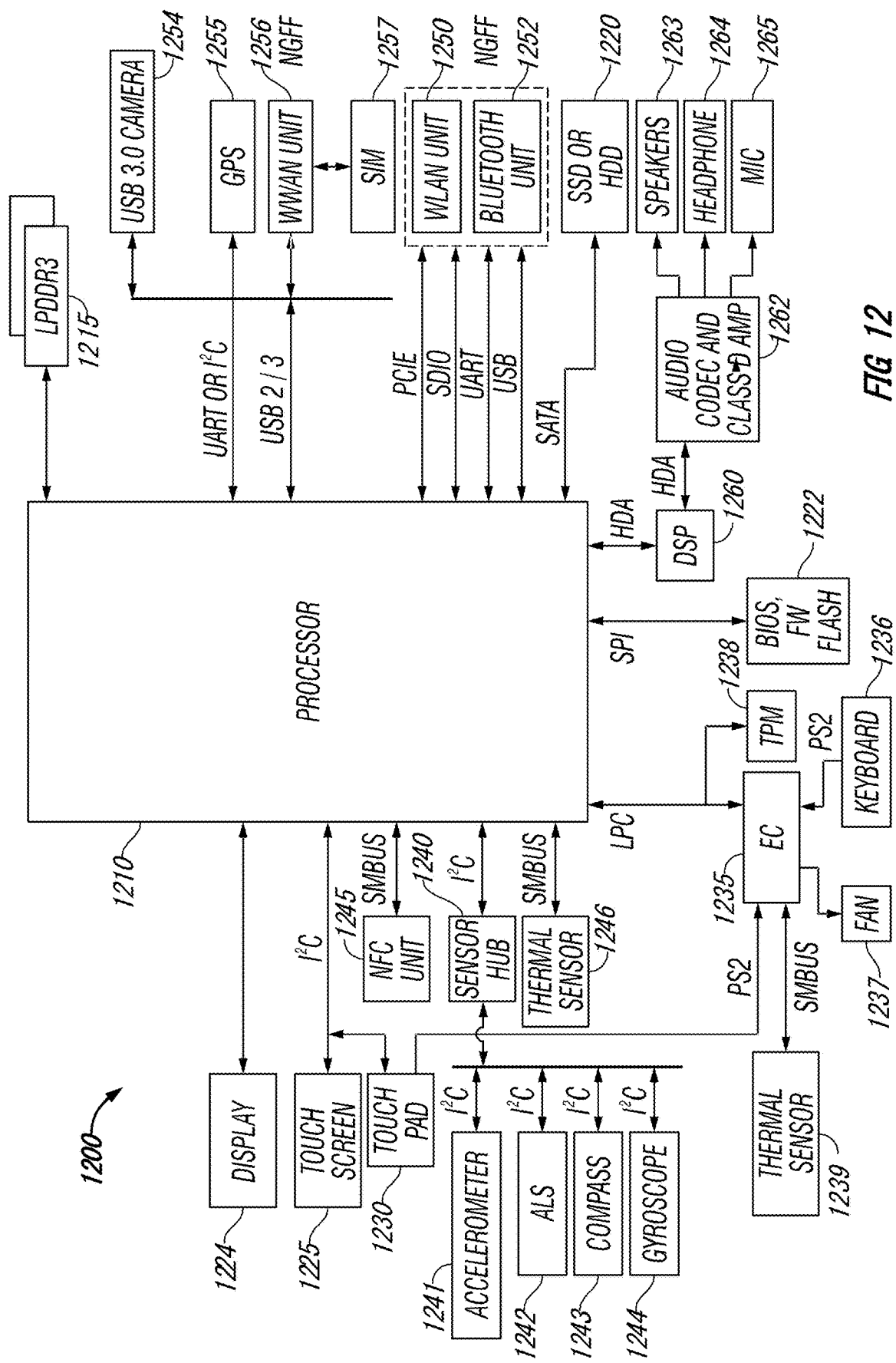
FIG. 12 illustrates another embodiment of a block diagram for a computing system.

Referring now to FIG. 12, a block diagram of components present in a computer system in accordance with an embodiment of the present disclosure is illustrated. As shown in FIG. 12, system 1200 includes any combination of components. These components may be implemented as ICs, portions thereof, discrete electronic devices, or other modules, logic, hardware, software, firmware, or a combination thereof adapted in a computer system, or as components otherwise incorporated within a chassis of the computer system. Note also that the block diagram of FIG. 12 is intended to show a high level view of many components of the computer system. However, it is to be understood that some of the components shown may be omitted, additional components may be present, and different arrangement of the components shown may occur in other implementations. As a result, the disclosure described above may be implemented in any portion of one or more of the interconnects illustrated or described below.

As seen in FIG. 12, a processor 1210, in one embodiment, includes a microprocessor, multi-core processor, multi-threaded processor, an ultra low voltage processor, an embedded processor, or other known processing element. In the illustrated implementation, processor 1210 acts as a main processing unit and central hub for communication with many of the various components of the system 1200. As one example, processor 1200 is implemented as a system on a chip (SoC). As a specific illustrative example, processor 1210 includes an Intel® Architecture Core™-based processor such as an i3, i5, i7 or another such processor available from Intel Corporation, Santa Clara, Calif. However, understand that other low power processors such as available from Advanced Micro Devices, Inc. (AMD) of Sunnyvale, Calif., a MIPS-based design from MIPS Technologies, Inc. of Sunnyvale, Calif., an ARM-based design licensed from ARM Holdings, Ltd. or customer thereof, or their licensees or adopters may instead be present in other embodiments such as an Apple A5/A6 processor, a Qualcomm Snapdragon processor, or TI OMAP processor. Note that many of the customer versions of such processors are modified and varied; however, they may support or recognize a specific instructions set that performs defined algorithms as set forth by the processor licensor. Here, the microarchitectural implementation may vary, but the architectural function of the processor is usually consistent. Certain details regarding the architecture and operation of processor 1210 in one implementation will be discussed further below to provide an illustrative example.

Processor 1210, in one embodiment, communicates with a system memory 1215. As an illustrative example, which in an embodiment can be implemented via multiple memory devices to provide for a given amount of system memory. As examples, the memory can be in accordance with a Joint Electron Devices Engineering Council (JEDEC) low power double data rate (LPDDR)-based design such as the current LPDDR2 standard according to JEDEC JESD 209-2E (published April 2009), or a next generation LPDDR standard to be referred to as LPDDR3 or LPDDR4 that will offer extensions to LPDDR2 to increase bandwidth. In various implementations the individual memory devices may be of different package types such as single die package (SDP), dual die package (DDP) or quad die package (67P). These devices, in some embodiments, are directly soldered onto a motherboard to provide a lower profile solution, while in other embodiments the devices are configured as one or more memory modules that in turn couple to the motherboard by a given connector. And of course, other memory implementations are possible such as other types of memory modules, e.g., dual inline memory modules (DIMMs) of different varieties including but not limited to microDIMMs, MiniDIMMs. In a particular illustrative embodiment, memory is sized between 2 GB and 16 GB, and may be configured as a DDR3LM package or an LPDDR2 or LPDDR3 memory that is soldered onto a motherboard via a ball grid array (BGA).

To provide for persistent storage of information such as data, applications, one or more operating systems and so forth, a mass storage 1220 may also couple to processor 1210. In various embodiments, to enable a thinner and lighter system design as well as to improve system responsiveness, this mass storage may be implemented via a SSD. However in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also shown in FIG. 12, a flash device 1222 may be coupled to processor 1210, e.g., via a serial peripheral interface (SPI). This flash device may provide for non-volatile storage of system software, including a basic input/output software (BIOS) as well as other firmware of the system.

In various embodiments, mass storage of the system is implemented by a SSD alone or as a disk, optical or other drive with an SSD cache. In some embodiments, the mass storage is implemented as a SSD or as a HDD along with a restore (RST) cache module. In various implementations, the HDD provides for storage of between 320 GB-4 terabytes (TB) and upward while the RST cache is implemented with a SSD having a capacity of 24 GB-256 GB. Note that such SSD cache may be configured as a single level cache (SLC) or multi-level cache (MLC) option to provide an appropriate level of responsiveness. In a SSD-only option, the module may be accommodated in various locations such as in a mSATA or NGFF slot. As an example, an SSD has a capacity ranging from 120 GB-1 TB.

Various input/output (IO) devices may be present within system 1200. Specifically shown in the embodiment of FIG. 12 is a display 1224 which may be a high definition LCD or LED panel configured within a lid portion of the chassis. This display panel may also provide for a touch screen 1225, e.g., adapted externally over the display panel such that via a user's interaction with this touch screen, user inputs can be provided to the system to enable desired operations, e.g., with regard to the display of information, accessing of information and so forth. In one embodiment, display 1224 may be coupled to processor 1210 via a display interconnect that can be implemented as a high performance graphics interconnect. Touch screen 1225 may be coupled to processor 1210 via another interconnect, which in an embodiment can be an I2C interconnect. As further shown in FIG. 12, in addition to touch screen 1225, user input by way of touch can also occur via a touch pad 1230 which may be configured within the chassis and may also be coupled to the same I2C interconnect as touch screen 1225.

The display panel may operate in multiple modes. In a first mode, the display panel can be arranged in a transparent state in which the display panel is transparent to visible light. In various embodiments, the majority of the display panel may be a display except for a bezel around the periphery. When the system is operated in a notebook mode and the display panel is operated in a transparent state, a user may view information that is presented on the display panel while also being able to view objects behind the display. In addition, information displayed on the display panel may be viewed by a user positioned behind the display. Or the operating state of the display panel can be an opaque state in which visible light does not transmit through the display panel.

In a tablet mode the system is folded shut such that the back display surface of the display panel comes to rest in a position such that it faces outwardly towards a user, when the bottom surface of the base panel is rested on a surface or held by the user. In the tablet mode of operation, the back display surface performs the role of a display and user interface, as this surface may have touch screen functionality and may perform other known functions of a conventional touch screen device, such as a tablet device. To this end, the display panel may include a transparency-adjusting layer that is disposed between a touch screen layer and a front display surface. In some embodiments the transparency-adjusting layer may be an electrochromic layer (EC), a LCD layer, or a combination of EC and LCD layers.

In various embodiments, the display can be of different sizes, e.g., an 11.6" or a 13.3" screen, and may have a 16:9 aspect ratio, and at least 300 nits brightness. Also the display may be of full high definition (HD) resolution (at least 1920×1080p), be compatible with an embedded display port (eDP), and be a low power panel with panel self refresh.

As to touch screen capabilities, the system may provide for a display multi-touch panel that is multi-touch capacitive and being at least 5 finger capable. And in some embodiments, the display may be 10 finger capable. In one embodiment, the touch screen is accommodated within a damage and scratch-resistant glass and coating (e.g., Gorilla Glass™ or Gorilla Glass 2™) for low friction to reduce "finger burn" and avoid "finger skipping". To provide for an enhanced touch experience and responsiveness, the touch panel, in some implementations, has multi-touch functionality, such as less than 2 frames (30 Hz) per static view during pinch zoom, and single-touch functionality of less than 1 cm per frame (30 Hz) with 200 ms (lag on finger to pointer). The display, in some implementations, supports edge-to-edge glass with a minimal screen bezel that is also flush with the panel surface, and limited IO interference when using multi-touch.

For perceptual computing and other purposes, various sensors may be present within the system and may be coupled to processor 1210 in different manners. Certain inertial and environmental sensors may couple to processor 1210 through a sensor hub 1240, e.g., via an I2C interconnect. In the embodiment shown in FIG. 12, these sensors may include an accelerometer 1241, an ambient light sensor (ALS) 1242, a compass 1243 and a gyroscope 1244. Other environmental sensors may include one or more thermal sensors 1246 which in some embodiments couple to processor 1210 via a system management bus (SMBus) bus.

Using the various inertial and environmental sensors present in a platform, many different use cases may be realized. These use cases enable advanced computing operations including perceptual computing and also allow for enhancements with regard to power management/battery life, security, and system responsiveness.

For example with regard to power management/battery life issues, based at least on part on information from an ambient light sensor, the ambient light conditions in a location of the platform are determined and intensity of the display controlled accordingly. Thus, power consumed in operating the display is reduced in certain light conditions.

As to security operations, based on context information obtained from the sensors such as location information, it may be determined whether a user is allowed to access certain secure documents. For example, a user may be permitted to access such documents at a work place or a home location. However, the user is prevented from accessing such documents when the platform is present at a public location. This determination, in one embodiment, is based on location information, e.g., determined via a GPS sensor or camera recognition of landmarks. Other security operations may include providing for pairing of devices within a close range of each other, e.g., a portable platform as described herein and a user's desktop computer, mobile telephone or so forth. Certain sharing, in some implementations, are realized via near field communication when these devices are so paired. However, when the devices exceed a certain range, such sharing may be disabled. Furthermore, when pairing a platform as described herein and a smartphone, an alarm may be configured to be triggered when the devices move more than a predetermined distance from each other, when in a public location. In contrast, when these paired devices are in a safe location, e.g., a work place or home location, the devices may exceed this predetermined limit without triggering such alarm.

Responsiveness may also be enhanced using the sensor information. For example, even when a platform is in a low power state, the sensors may still be enabled to run at a relatively low frequency. Accordingly, any changes in a location of the platform, e.g., as determined by inertial sensors, GPS sensor, or so forth is determined. If no such changes have been registered, a faster connection to a previous wireless hub such as a Wi-Fi™ access point or similar wireless enabler occurs, as there is no need to scan for available wireless network resources in this case. Thus, a greater level of responsiveness when waking from a low power state is achieved.

It is to be understood that many other use cases may be enabled using sensor information obtained via the integrated sensors within a platform as described herein, and the above examples are only for purposes of illustration. Using a system as described herein, a perceptual computing system may allow for the addition of alternative input modalities, including gesture recognition, and enable the system to sense user operations and intent.

In some embodiments one or more infrared or other heat sensing elements, or any other element for sensing the presence or movement of a user may be present. Such sensing elements may include multiple different elements working together, working in sequence, or both. For example, sensing elements include elements that provide initial sensing, such as light or sound projection, followed by sensing for gesture detection by, for example, an ultrasonic time of flight camera or a patterned light camera.

Also in some embodiments, the system includes a light generator to produce an illuminated line. In some embodiments, this line provides a visual cue regarding a virtual boundary, namely an imaginary or virtual location in space, where action of the user to pass or break through the virtual boundary or plane is interpreted as an intent to engage with the computing system. In some embodiments, the illuminated line may change colors as the computing system transitions into different states with regard to the user. The illuminated line may be used to provide a visual cue for the user of a virtual boundary in space, and may be used by the system to determine transitions in state of the computer with regard to the user, including determining when the user wishes to engage with the computer.

In some embodiments, the computer senses user position and operates to interpret the movement of a hand of the user through the virtual boundary as a gesture indicating an intention of the user to engage with the computer. In some embodiments, upon the user passing through the virtual line or plane the light generated by the light generator may change, thereby providing visual feedback to the user that the user has entered an area for providing gestures to provide input to the computer.

Display screens may provide visual indications of transitions of state of the computing system with regard to a user. In some embodiments, a first screen is provided in a first state in which the presence of a user is sensed by the system, such as through use of one or more of the sensing elements.

In some implementations, the system acts to sense user identity, such as by facial recognition. Here, transition to a second screen may be provided in a second state, in which the computing system has recognized the user identity, where this second the screen provides visual feedback to the user that the user has transitioned into a new state. Transition to a third screen may occur in a third state in which the user has confirmed recognition of the user.

In some embodiments, the computing system may use a transition mechanism to determine a location of a virtual boundary for a user, where the location of the virtual boundary may vary with user and context. The computing system may generate a light, such as an illuminated line, to indicate the virtual boundary for engaging with the system. In some embodiments, the computing system may be in a waiting state, and the light may be produced in a first color. The computing system may detect whether the user has reached past the virtual boundary, such as by sensing the presence and movement of the user using sensing elements.

In some embodiments, if the user has been detected as having crossed the virtual boundary (such as the hands of the user being closer to the computing system than the virtual boundary line), the computing system may transition to a state for receiving gesture inputs from the user, where a mechanism to indicate the transition may include the light indicating the virtual boundary changing to a second color.

In some embodiments, the computing system may then determine whether gesture movement is detected. If gesture movement is detected, the computing system may proceed with a gesture recognition process, which may include the use of data from a gesture data library, which may reside in memory in the computing device or may be otherwise accessed by the computing device.

If a gesture of the user is recognized, the computing system may perform a function in response to the input, and return to receive additional gestures if the user is within the virtual boundary. In some embodiments, if the gesture is not recognized, the computing system may transition into an error state, where a mechanism to indicate the error state may include the light indicating the virtual boundary changing to a third color, with the system returning to receive additional gestures if the user is within the virtual boundary for engaging with the computing system.

As mentioned above, in other embodiments the system can be configured as a convertible tablet system that can be used in at least two different modes, a tablet mode and a notebook mode. The convertible system may have two panels, namely a display panel and a base panel such that in the tablet mode the two panels are disposed in a stack on top of one another. In the tablet mode, the display panel faces outwardly and may provide touch screen functionality as found in conventional tablets. In the notebook mode, the two panels may be arranged in an open clamshell configuration.

In various embodiments, the accelerometer may be a 3-axis accelerometer having data rates of at least 50 Hz. A gyroscope may also be included, which can be a 3-axis gyroscope. In addition, an e-compass/magnetometer may be present. Also, one or more proximity sensors may be provided (e.g., for lid open to sense when a person is in proximity (or not) to the system and adjust power/performance to extend battery life). For some OS's Sensor Fusion capability including the accelerometer, gyroscope, and compass may provide enhanced features. In addition, via a sensor hub having a real-time clock (RTC), a wake from sensors mechanism may be realized to receive sensor input when a remainder of the system is in a low power state.

In some embodiments, an internal lid/display open switch or sensor to indicate when the lid is closed/open, and can be used to place the system into Connected Standby or automatically wake from Connected Standby state. Other system sensors can include ACPI sensors for internal processor, memory, and skin temperature monitoring to enable changes to processor and system operating states based on sensed parameters.

In an embodiment, the OS may be a Microsoft® Windows® 8 OS that implements Connected Standby (also referred to herein as Win8 CS). Windows 8 Connected Standby or another OS having a similar state can provide, via a platform as described herein, very low ultra idle power to enable applications to remain connected, e.g., to a cloud-based location, at very low power consumption. The platform can supports 3 power states, namely screen on (normal); Connected Standby (as a default "off" state); and shutdown (zero watts of power consumption). Thus in the Connected Standby state, the platform is logically on (at minimal power levels) even though the screen is off. In such a platform, power management can be made to be transparent to applications and maintain constant connectivity, in part due to offload technology to enable the lowest powered component to perform an operation.

Also seen in FIG. 12, various peripheral devices may couple to processor 1210 via a low pin count (LPC) interconnect. In the embodiment shown, various components can be coupled through an embedded controller 1235. Such components can include a keyboard 1236 (e.g., coupled via a PS2 interface), a fan 1237, and a thermal sensor 1239. In some embodiments, touch pad 1230 may also couple to EC 1235 via a PS2 interface. In addition, a security processor such as a trusted platform module (TPM) 1238 in accordance with the Trusted Computing Group (TCG) TPM Specification Version 1.2, dated Oct. 2, 2003, may also couple to processor 1210 via this LPC interconnect. However, understand the scope of the present disclosure is not limited in this regard and secure processing and storage of secure information may be in another protected location such as a static random access memory (SRAM) in a security coprocessor, or as encrypted data blobs that are only decrypted when protected by a secure enclave (SE) processor mode.

In a particular implementation, peripheral ports may include a high definition media interface (HDMI) connector (which can be of different form factors such as full size, mini or micro); one or more USB ports, such as full-size external ports in accordance with the Universal Serial Bus Revision 3.0 Specification (November 2008), with at least one powered for charging of USB devices (such as smartphones) when the system is in Connected Standby state and is plugged into AC wall power. In addition, one or more Thunderbolt™ ports can be provided. Other ports may include an externally accessible card reader such as a full size SD-XC card reader and/or a SIM card reader for WWAN (e.g., an 8 pin card reader). For audio, a 3.5 mm jack with stereo sound and microphone capability (e.g., combination functionality) can be present, with support for jack detection (e.g., headphone only support using microphone in the lid or headphone with microphone in cable). In some embodiments, this jack can be re-taskable between stereo headphone and stereo microphone input. Also, a power jack can be provided for coupling to an AC brick.

System 1200 can communicate with external devices in a variety of manners, including wirelessly. In the embodiment shown in FIG. 12, various wireless modules, each of which can correspond to a radio configured for a particular wireless communication protocol, are present. One manner for wireless communication in a short range such as a near field may be via a near field communication (NFC) unit 1245 which may communicate, in one embodiment with processor 1210 via an SMBus. Note that via this NFC unit 1245, devices in close proximity to each other can communicate. For example, a user can enable system 1200 to communicate with another (e.g.) portable device such as a smartphone of the user via adapting the two devices together in close relation and enabling transfer of information such as identification information payment information, data such as image data or so forth. Wireless power transfer may also be performed using a NFC system.

Using the NFC unit described herein, users can bump devices side-to-side and place devices side-by-side for near field coupling functions (such as near field communication and wireless power transfer (WPT)) by leveraging the coupling between coils of one or more of such devices. More specifically, embodiments provide devices with strategically shaped, and placed, ferrite materials, to provide for better coupling of the coils. Each coil has an inductance associated with it, which can be chosen in conjunction with the resistive, capacitive, and other features of the system to enable a common resonant frequency for the system.

As further seen in FIG. 12, additional wireless units can include other short range wireless engines including a WLAN unit 1250 and a Bluetooth unit 1252. Using WLAN unit 1250, Wi-Fi™ communications in accordance with a given Institute of Electrical and Electronics Engineers (IEEE) 802.11 standard can be realized, while via Bluetooth unit 1252, short range communications via a Bluetooth protocol can occur. These units may communicate with processor 1210 via, e.g., a USB link or a universal asynchronous receiver transmitter (UART) link. Or these units may couple to processor 1210 via an interconnect according to a Peripheral Component Interconnect Express™ (PCIe™) protocol, e.g., in accordance with the PCI Express™ Specification Base Specification version 3.0 (published Jan. 17, 2007), or another such protocol such as a serial data input/output (SDIO) standard. Of course, the actual physical connection between these peripheral devices, which may be configured on one or more add-in cards, can be by way of the NGFF connectors adapted to a motherboard.

In addition, wireless wide area communications, e.g., according to a cellular or other wireless wide area protocol, can occur via a WWAN unit 1256 which in turn may couple to a subscriber identity module (SIM) 1257. In addition, to enable receipt and use of location information, a GPS module 1255 may also be present. Note that in the embodiment shown in FIG. 12, WWAN unit 1256 and an integrated capture device such as a camera module 1254 may communicate via a given USB protocol such as a USB 2.0 or 3.0 link, or a UART or I2C protocol. Again the actual physical connection of these units can be via adaptation of a NGFF add-in card to an NGFF connector configured on the motherboard.

In a particular embodiment, wireless functionality can be provided modularly, e.g., with a WiFi™ 802.11ac solution (e.g., add-in card that is backward compatible with IEEE 802.11abgn) with support for Windows 8 CS. This card can be configured in an internal slot (e.g., via an NGFF adapter). An additional module may provide for Bluetooth capability (e.g., Bluetooth 4.0 with backwards compatibility) as well as Intel® Wireless Display functionality. In addition NFC support may be provided via a separate device or multi-function device, and can be positioned as an example, in a front right portion of the chassis for easy access. A still additional module may be a WWAN device that can provide support for 3G/4G/LTE and GPS. This module can be implemented in an internal (e.g., NGFF) slot. Integrated antenna support can be provided for WiFi™, Bluetooth, WWAN, NFC and GPS, enabling seamless transition from WiFi™ to WWAN radios, wireless gigabit (WiGig) in accordance with the Wireless Gigabit Specification (July 2010), and vice versa.

As described above, an integrated camera can be incorporated in the lid. As one example, this camera can be a high resolution camera, e.g., having a resolution of at least 2.0 megapixels (MP) and extending to 6.0 MP and beyond.

To provide for audio inputs and outputs, an audio processor can be implemented via a digital signal processor (DSP) 1260, which may couple to processor 1210 via a high definition audio (HDA) link. Similarly, DSP 1260 may communicate with an integrated coder/decoder (CODEC) and amplifier 1262 that in turn may couple to output speakers 1263 which may be implemented within the chassis. Similarly, amplifier and CODEC 1262 can be coupled to receive audio inputs from a microphone 1265 which in an embodiment can be implemented via dual array microphones (such as a digital microphone array) to provide for high quality audio inputs to enable voice-activated control of various operations within the system. Note also that audio outputs can be provided from amplifier/CODEC 1262 to a headphone jack 1264. Although shown with these particular components in the embodiment of FIG. 12, understand the scope of the present disclosure is not limited in this regard.

In a particular embodiment, the digital audio codec and amplifier are capable of driving the stereo headphone jack, stereo microphone jack, an internal microphone array and stereo speakers. In different implementations, the codec can be integrated into an audio DSP or coupled via an HD audio path to a peripheral controller hub (PCH). In some implementations, in addition to integrated stereo speakers, one or more bass speakers can be provided, and the speaker solution can support DTS audio.

In some embodiments, processor 1210 may be powered by an external voltage regulator (VR) and multiple internal voltage regulators that are integrated inside the processor die, referred to as fully integrated voltage regulators (FIVRs). The use of multiple FIVRs in the processor enables the grouping of components into separate power planes, such that power is regulated and supplied by the FIVR to only those components in the group. During power management, a given power plane of one FIVR may be powered down or off when the processor is placed into a certain low power state, while another power plane of another FIVR remains active, or fully powered.

In one embodiment, a sustain power plane can be used during some deep sleep states to power on the I/O pins for several I/O signals, such as the interface between the processor and a PCH, the interface with the external VR and the interface with EC 1235. This sustain power plane also powers an on-die voltage regulator that supports the on-board SRAM or other cache memory in which the processor context is stored during the sleep state. The sustain power plane is also used to power on the processor's wakeup logic that monitors and processes the various wakeup source signals.

During power management, while other power planes are powered down or off when the processor enters certain deep sleep states, the sustain power plane remains powered on to support the above-referenced components. However, this can lead to unnecessary power consumption or dissipation when those components are not needed. To this end, embodiments may provide a connected standby sleep state to maintain processor context using a dedicated power plane. In one embodiment, the connected standby sleep state facilitates processor wakeup using resources of a PCH which itself may be present in a package with the processor. In one embodiment, the connected standby sleep state facilitates sustaining processor architectural functions in the PCH until processor wakeup, this enabling turning off all of the unnecessary processor components that were previously left powered on during deep sleep states, including turning off all of the clocks. In one embodiment, the PCH contains a time stamp counter (TSC) and connected standby logic for controlling the system during the connected standby state. The integrated voltage regulator for the sustain power plane may reside on the PCH as well.

In an embodiment, during the connected standby state, an integrated voltage regulator may function as a dedicated power plane that remains powered on to support the dedicated cache memory in which the processor context is stored such as critical state variables when the processor enters the deep sleep states and connected standby state. This critical state may include state variables associated with the architectural, micro-architectural, debug state, and/or similar state variables associated with the processor.

The wakeup source signals from EC 1235 may be sent to the PCH instead of the processor during the connected standby state so that the PCH can manage the wakeup processing instead of the processor. In addition, the TSC is maintained in the PCH to facilitate sustaining processor architectural functions. Although shown with these particular components in the embodiment of FIG. 12, understand the scope of the present disclosure is not limited in this regard.

Power control in the processor can lead to enhanced power savings. For example, power can be dynamically allocate between cores, individual cores can change frequency/voltage, and multiple deep low power states can be provided to enable very low power consumption. In addition, dynamic control of the cores or independent core portions can provide for reduced power consumption by powering off components when they are not being used.

Some implementations may provide a specific power management IC (PMIC) to control platform power. Using this solution, a system may see very low (e.g., less than 5%) battery degradation over an extended duration (e.g., 16 hours) when in a given standby state, such as when in a Win8 Connected Standby state. In a Win8 idle state a battery life exceeding, e.g., 9 hours may be realized (e.g., at 150 nits). As to video playback, a long battery life can be realized, e.g., full HD video playback can occur for a minimum of 6 hours.

A platform in one implementation may have an energy capacity of, e.g., 35 watt hours (Whr) for a Win8 CS using an SSD and (e.g.) 40-44 Whr for Win8 CS using an HDD with a RST cache configuration.

A particular implementation may provide support for 15 W nominal CPU thermal design power (TDP), with a configurable CPU TDP of up to approximately 25 W TDP design point. The platform may include minimal vents owing to the thermal features described above. In addition, the platform is pillow-friendly (in that no hot air is blowing at the user). Different maximum temperature points can be realized depending on the chassis material. In one implementation of a plastic chassis (at least having to lid or base portion of plastic), the maximum operating temperature can be 52 degrees Celsius (C). And for an implementation of a metal chassis, the maximum operating temperature can be 46° C.

In different implementations, a security module such as a TPM can be integrated into a processor or can be a discrete device such as a TPM 2.0 device. With an integrated security module, also referred to as Platform Trust Technology (PTT), BIOS/firmware can be enabled to expose certain hardware features for certain security features, including secure instructions, secure boot, Intel® Anti-Theft Technology, Intel® Identity Protection Technology, Intel® Trusted Execution Technology (TXT), and Intel® Manageability Engine Technology along with secure user interfaces such as a secure keyboard and display.

Figure 13:
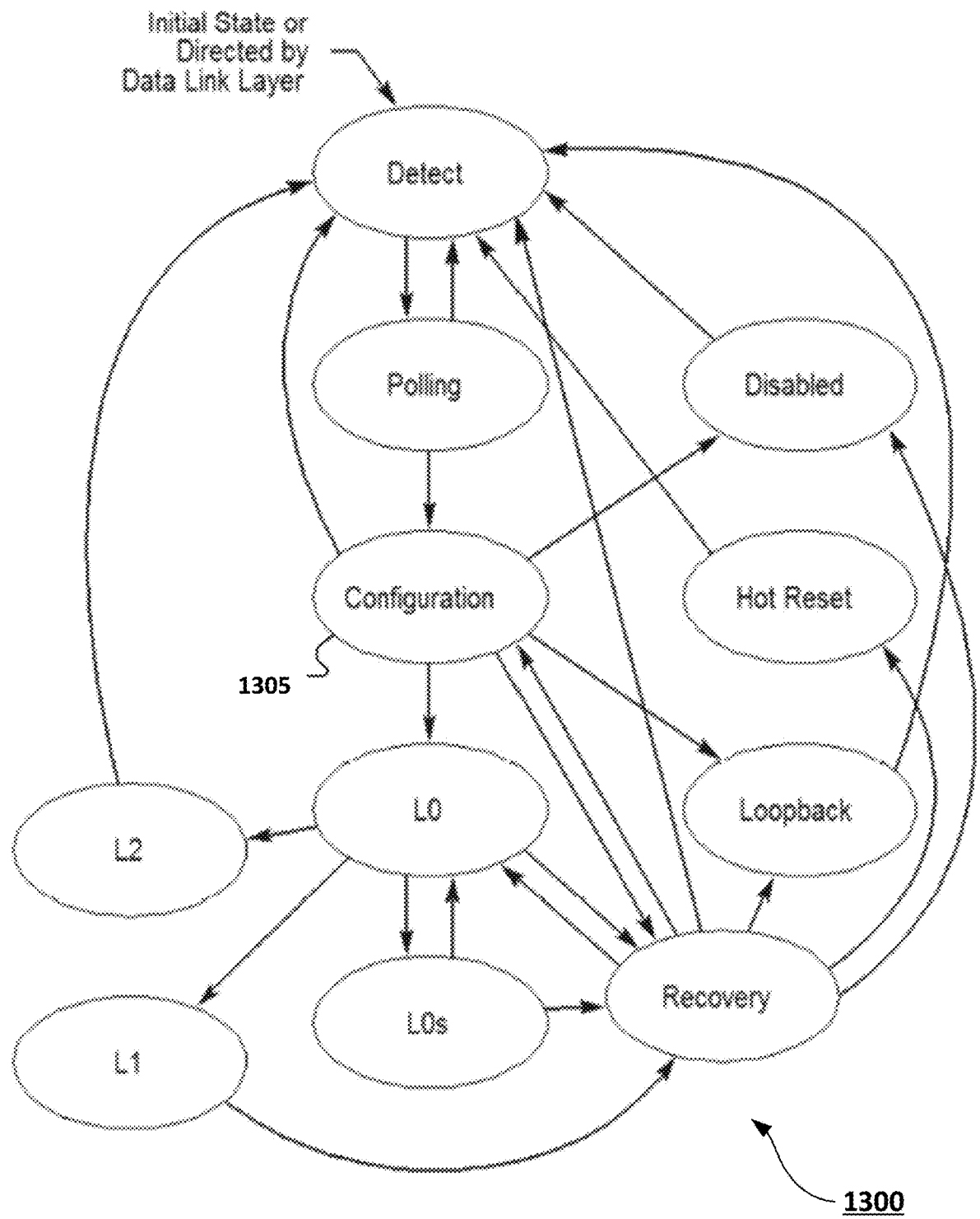
FIG. 13 is a diagram illustrating an example link training state machine.

Turning to the diagram 1300 of FIG. 13, an example link training state machine is shown, such as the PCIe link training and status state machine (LTSSM). For a system utilizing a PHY according to a particular protocol to support multiple alternative protocols (i.e., to run on top of the PHY), ordered sets may be defined that are to be communicated between two or more devices on a link in connection with the training of the link. For instance, training set (TS) ordered sets (OSes) may be sent. In an implementation utilizing PCIe as the PHY protocol, the TS ordered sets may include a TS1 and a TS2 ordered set, among other example ordered sets. The ordered sets and training sequences sent during link training may be based on the particular link training state, with various link training states utilized to accomplish corresponding link training activities and objectives.

In one example, such as illustrated in FIG. 13, a link training state machine 1300 may include such states as a Reset state, a Detect state (e.g., to detect a far end termination (e.g., another device connected to the lanes), a Polling state (e.g., to establish symbol lock and configure lane polarity), a Configuration (or "Config") state (e.g., to configure the physical lanes of a connection into a link with particular lane width, lane numbering, etc., performing lane-to-lane deskew and other link configuration activities), a Loopback state (e.g., to perform testing, fault isolation, equalization, and other tasks), a Recovery state (e.g., for use to change the data rate of operation, re-establish bit lock, Symbol lock or block alignment, perform lane-to-lane deskew, etc.) among other states, which may be utilized to bring the link to an active link state (e.g., L0). In one example, training sequences to be sent in a particular one (or more) of the link training states may be defined to accommodate the negotiation of a particular one of the supported protocols of a particular device. For instance, the particular training state may be a training state preceding entry into an active link state, or a training state in which the data rate may be upscaled (e.g., beyond that supported by at least one of the supported protocols), such as a PCIe state where a data rate transitions from a Gen1 speed to Gen3 and higher speeds, among other examples. For instance, in the example implementation shown in FIG. 13, a configuration state (e.g., 1305) may be utilized and augmented to allow negotiation of a particular one of multiple protocols in parallel with the link training activities defined natively in the training state (e.g., lane width determination, lane numbering, deskew, equalization, etc.). For instance, particular training sequences may be defined for the training state and these training sequences may be augmented to allow information to be communicated (e.g., in one or more fields or symbols of the ordered set) to identify whether each device on the link supports multiple protocols (e.g., at least one protocol stack other than the protocol stack of the physical layer and the corresponding link training state machine), identify the particular protocols each device supports, and agree upon one or more protocols to employ over the particular PHY (e.g., through a handshake accomplished through the transmission of these training sequences across the link (in both the upstream and downstream directions)).

In one example, a PCIe physical layer may be utilized to support multiple different protocols. Accordingly, a particular training state in a PCIe LTSSM may be utilized for the negotiation of protocols between devices on a link. As noted above, the protocol determination may occur even before the link trains to an active state (e.g., L0) in the lowest supported data rate (e.g., the PCIe Gen 1 data rate). In one example, the PCIe Config state may be used. Indeed, the PCIe LTSSM may be used to negotiate the protocol by using modified PCIe Training Sets (e.g., TS1 and TS2) after the link width negotiation and (at least partially) in parallel with lane numbering performed during the Config state.

FIGS. 14A-14C are simplified block diagrams 1400a-c illustrating example implementations of a link interconnecting two system components, or devices, such as upstream component 1405a and downstream component 1410a. An upstream component 1405a and downstream component 1410a can be connected directly, in some instances, with no retimers, redrivers, or repeaters disposed on the link between the two components 1405a, 1410a, such as shown in the example of FIG. 14A. In other instances, a retimer (e.g., 1415) can be provided to extend the link connecting upstream component 1405b and downstream component 1410b, such as illustrated in FIG. 14B. In still other implementations, two or more retimers (e.g., 1420, 1425) can be provided in series to further extend a link connecting upstream component 1405c and downstream component 1410c. For instance, a particular interconnect technology or protocol may specify a maximum channel length and one or more retimers (e.g., 1420, 1425), can be provided to extend the physical length of the channel connecting two devices 1405c, 1410c. For instance, providing retimers 1420, 1425 between upstream component 1405c and downstream component 1410c can allow a link three times the maximum length specified for a link without these retimers e.g., 1420, 1425, among other example implementations.

Figure 15B:
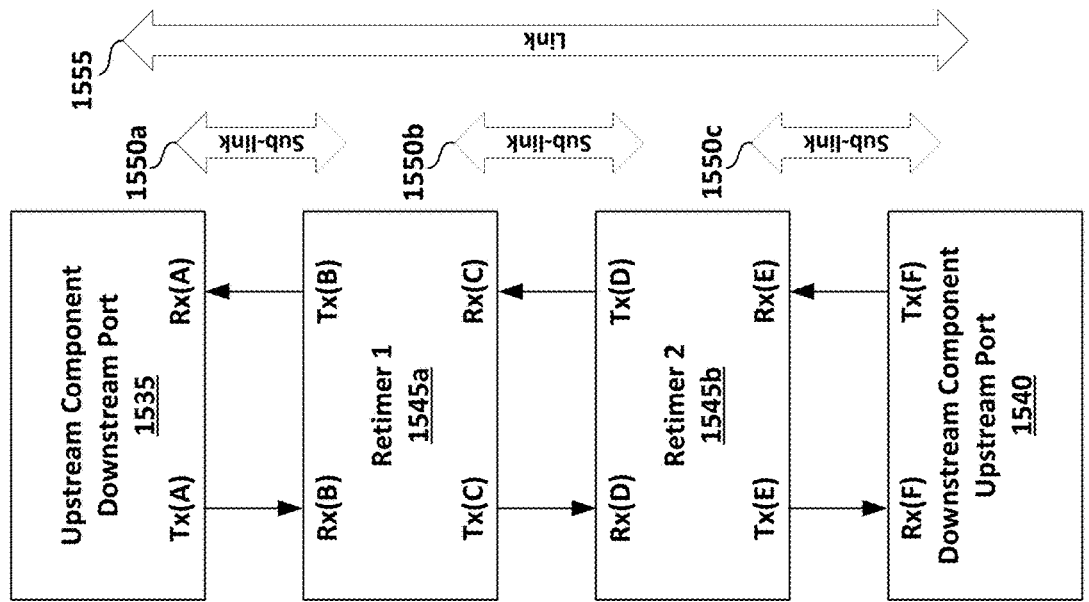
FIGS. 15A-15B are simplified block diagrams of example links that include one or more retimers in accordance with embodiments of the present disclosure.
Figure 15A:
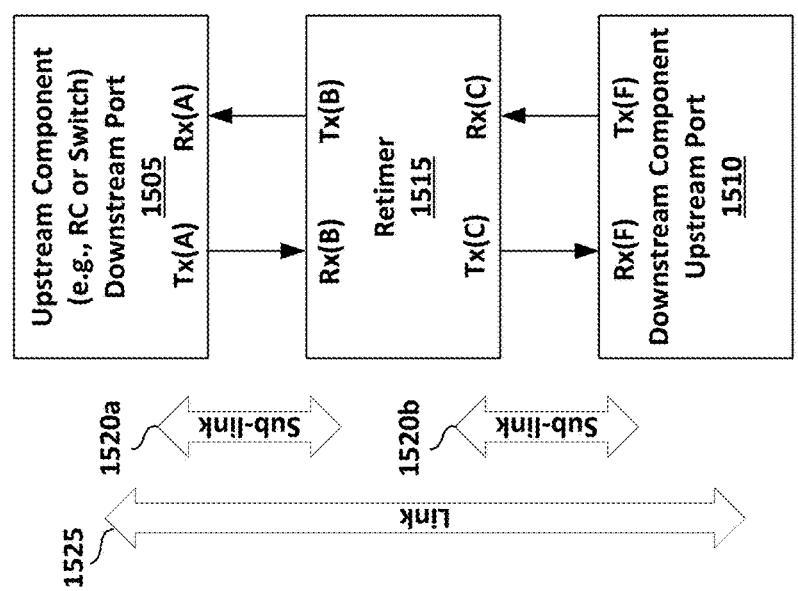

A link incorporating one or more retimers can form two or more separate electrical sub-links at data rates comparable to data rates realized by links employing similar protocols but with no retimers. For instance, a link including a single retimer can form a link with two separate sub-links, each operating at 8.0 GT/s or higher. FIGS. 15A-15B illustrate simplified block diagrams 1500a-b of example links including one or more retimers. For instance, in FIG. 15A, a link 1525 connecting a first component 1505 (e.g., an upstream component, such as a root complex or port switch) to a second component 1510 (e.g., a downstream component) can include a single retimer 1515a. A first sublink 1520a can connect the first component 1505 to the retimer 1515a and a second sublink 1520b can connect the retimer 1515a to the second component.

In some implementations, a link, such as a PCIe-compliant link, can include one or more retimers or other extension devices, such as a repeater. A retimer device (or simply "retimer"), can include active electronic devices that receive and re-transmit (retime) digital I/O signals. Retimers can be used to extend the length of a channel that can be used with a digital I/O bus. Retimers can be protocol aware, software transparent, and capable of executing a link equalization procedure, such as the link equalization procedure of PCIe.

As shown in FIG. 15B, multiple retimers 1545a, 1545b can be utilized to extend a link 1555. Three sublinks 1550a-c can be defined through the two retimers 1545a, 1545b, with a first sublink 1555a connecting the first component 1535 to the first retimer 1545a, a second sublink 1550b connecting the first retimer 1545a to the second retimer 1545b, and the third sublink 1555c connecting the second retimer 1545b to the second component 1540.

A primary function of a retimer (buffer) device is signal re-timing. These functions are performed by re-timer circuitry blocks 506 (one block for each direction), as shown. The particular retimer device circuits will depend on the PHY being used for the link. Generally, retimer circuitry is configured to recover the incoming signal and retransmit using a local clock and new transmit equalization circuitry, and may typically employ well-known circuitry for this purpose, such as phase lock loops. A retimer may further comprise transmitter and receiver circuitry including one or more amplifier circuits, as well as various types of well-known signal-conditioning circuitry used to increase the drive level of a received signal. Such retimer circuitry is well-known to those skilled in the high-speed interconnect arts, and, accordingly, no further details are shown or discussed herein.

Each retimer 1515, 1545a, 1545b can have an upstream path and a downstream path. In some implementations, a retimer can include two pseudo ports, and the pseudo ports can determine their respective downstream/upstream orientation dynamically. Further, retimers 1515, 1545a, 1545b can support operating modes including a forwarding mode and an executing mode. Retimers 1515, 1545a, 1545b in some instances can decode data received on the sub-link and re-encode the data that it is to forward downstream on its other sublink. As such, retimers may capture the received bit stream prior to regenerating and re-transmitting the bit stream to another device or even another retimer (or redriver or repeater). In some cases, the retimer can modify some values in the data it receives, such as when processing and forwarding ordered set data. Additionally, a retimer can potentially support any width option as its maximum width, such as a set of width options defined by a specification such as PCIe.

As data rates of serial interconnects (e.g., PCIe, UPI, USB, etc.) increase, retimers are increasingly used to extend the channel reach. Multiple retimers can be cascaded for even longer channel reach. It is expected that as signal speeds increase, channel reach will typically decrease as a general matter. Accordingly, as interconnect technologies accelerate, the use of retimers may become more common. As an example, as PCIe Gen-4, with its 16 GT/s, is adopted in favor of PCIe Gen-3 (8 GT/s), the use of retimers in PCIe interconnects may increase, as may be the case in other interconnects as speeds increase.

In one implementation, a common BGA (Ball Grid Array) footprint may be defined for PCI Express Gen-4 (16 GT/s) based retimers. Such a design may address at least some of the example shortcomings found in conventional PCIe Gen-3 (8 GT/s) retimer devices, as well as some of the issues emerging with the adoption of PCIe Gen-4. Further, for PCIe Gen-4, the number of retimer vendors and volume are expected to increase. Due to signal losses from the doubled data rate (from 8 GT/s to 16 GT/s), the interconnect length achievable is significantly decreased in Gen-4. In this and other example interconnect technologies, as data rate increases, retimers may thereby have increased utility as they can be used to dramatically increase channel lengths that would be otherwise constrained by the increased data rate.

Although shown to be separate from the upstream component and downstream component, the retimer can be part of the upstream or downstream components, on board with the upstream or downstream components, or on package with the downstream component.

While this disclosure has been described with respect to a limited number of embodiments, those skilled in the art will appreciate numerous modifications and variations therefrom. It is intended that the appended claims cover all such modifications and variations as fall within the true spirit and scope of this present disclosure.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the microcontroller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase "to" or "configured to," in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element.

A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

The systems, methods, and apparatuses can include one or a combination of the following examples:

Example 1 is an apparatus comprising a first port to receive data, the first port configured to support a first link width and frequency; a second port to transmit data, the second port configured to support a second link width and frequency, the second link width and frequency different from the first link width and frequency, wherein the first link width and frequency comprises a first link width and a first link frequency and the second link width and frequency comprises a second link width and a second link frequency; and physical layer logic to receive from the first port a first data block arranged according to the first link width and frequency; create at least one second data block arranged according the second link width and frequency, the at least one second data block including data bytes from the first data block arranged sequentially in the at least one second data block; and transmit the at least one second data block to the second port.

Example 2 may include the subject matter of example 21, wherein the first link width is larger than the second link width.

Example 3 may include the subject matter of example 2, wherein the physical layer logic comprises logic circuitry to receive the first data block from the first port, the first data block arranged according to the first link width; create the second data block by mapping bytes from the first data block into the second data block, the second data block arranged according to the second link width; and create a third data block by mapping remaining bytes from the first data block into the third data block, the third data block arranged according to the second link width.

Example 4 may include the subject matter of example 2, wherein the physical layer logic comprises logic circuitry to receive an ordered set block from the first port; create the second data block according to the second link width by mapping bytes from the first data block into the second data block; create a third data block according to the second link width by mapping remaining bytes from the first data block into the third data block; and populating at least a portion of the third data block with bytes from the ordered set block.

Example 5 may include the subject matter of example 4, wherein the ordered set block comprises a skip ordered set (SKPOS), and the logic circuitry is to create the third data block according to the second link width, the third data block comprising a SKP OS block followed by idle bytes.

Example 6 may include the subject matter of example 4, wherein the ordered set block comprises an electrical idle exit ordered set (EIEOS), and the logic circuitry is to create the third data block according to the second link width with EIEOS bytes followed by training Ordered sets.

Example 7 may include the subject matter of example 4, wherein the ordered set block comprises an electrical idle ordered set (EIOS), the logic circuitry to create the third data block with EIOS bytes and set one or more links to electrical idle after transmitting the third data block.

Example 8 may include the subject matter of example 4, wherein the ordered set comprises a start data stream (SDS) byte, the logic circuitry to transmit the SDS on one of the second or third data block, and create the third data block arranged according to the second link width with at least some idle bytes.

Example 9 may include the subject matter of example 2, wherein the first link width comprises a maximum link with associated with a link that is compliant with one of a generation 4 or generation 5 Peripheral Component Interconnect Express (PCIe) protocol and the second link width comprises a maximum link with associated with a link that is compliant with one of a generation 5 or generation 6 PCIe protocol, respectively.

Example 10 may include the subject matter of example 1, wherein the first link width is smaller than the second link width.

Example 11 may include the subject matter of example 10, wherein the physical layer logic comprises logic circuitry to receive the first data block from the first port, the first data block arranged according to the first link width; receive a third data block from the first port, the third data block arranged according to the first link width; and create the second data block by mapping bytes from the first data block and the third data block into the second data block, the second data block arranged according to the second link width.

Example 12 may include the subject matter of example 10, wherein the physical layer logic comprises logic circuitry to receive the first data block from the first port; receive a third block from the first port, the third block comprising an ordered set block; create the second data block according to the second link width by mapping bytes from the first data block into the second data block; populating at least a portion of the second data block with bytes from the ordered set block after an end data stream byte.

Example 13 may include the subject matter of example 10, wherein the first link width comprises a maximum link with associated with a link that is compliant with one of a generation 5 or generation 6 Peripheral Component Interconnect Express (PCIe) protocol and the second link width comprises a maximum link with associated with a link that is compliant with one of a generation 4 or generation 5 PCIe protocol, respectively.

Example 14 may include the subject matter of example 1, wherein the physical layer logic comprising multiplexer circuitry to map bytes from the first data block to the second data block.

Example 15 may include the subject matter of examples 1-14, wherein the apparatus comprises a retimer.

Example 16 is a method comprising receiving, at a first port, the first port supporting a first link width, a data block arranged according to the first link width; mapping bytes from the data block to a second data block, the second data block arranged according to a second link width; and transmitting the second data block from a second port, the second port supporting the second link width.

Example 17 may include the subject matter of example 16, wherein the first link width is larger than the second link width, the method comprising mapping bytes sequentially from the first data block into the second data block and into a third data block.

Example 18 may include the subject matter of example 17, further comprising receiving an ordered set block from the first port; mapping at least some of the ordered set block into one of the second data block or the third data block.

Example 19 may include the subject matter of example 17, wherein the ordered set block comprises one of a skip ordered set, an electrical idle ordered set, or an electrical idle exit ordered set.

Example 20 may include the subject matter of example 16, wherein the first link width is smaller than the second link width, the method comprising mapping bytes sequentially from the first data block into the second data block; and mapping bytes sequentially from a third data block into remaining bytes of the second data block, the third data block received after the first data block.

Example 21 may include the subject matter of example 20, further comprising receiving an ordered set block from the first port; mapping at least some bytes from the ordered set block into the second data block.

Example 22 may include the subject matter of example 20, wherein the ordered set block comprises one of a skip ordered set, an electrical idle ordered set, or an electrical idle exit ordered set.

Example 23 is a system comprising an upstream device; a width and frequency converter device coupled to the upstream device across a first link, the first link comprising a first link width; and a downstream device, the downstream device coupled to the width and frequency converter device across a second link, the second link comprising a second link width; the width and frequency converter device comprising a first port supporting the first link and the first link width; a second port supporting the second link and second link, the second link width different from the first link width; and physical layer logic to receive from the first port a first data block arranged according to the first link width; sequentially map bytes from the first data block to a second data block, the second data block arranged according to the second link width; and transmit the second data block to the second port.

Example 24 may include the subject matter of example 23, wherein the first link width is larger than the second link width, the width and frequency converter device to map bytes sequentially from the first data block into the second data block and into a third data block.

Example 25 may include the subject matter of example 23, wherein the first link width is smaller than the second link width, the width and frequency converter device to map bytes sequentially from the first data block into the second data block; and map bytes sequentially from a third data block into remaining bytes of the second data block, the third data block received after the first data block.

If a first port (e.g., UP) is operating at data rate Gen 1 . . . N (in this example, Gen 1, 2, 3, 4) then the WFC device can cause a corresponding second port (e.g., DN) to downshift to half the link width, and act as a retimer with both sides being on the same width and data rate. For the case where the WFC device has to perform the width/frequency conversion (e.g., x16 Gen 4→x8 Gen 5), it has to take each data block from 2x Lanes and convert to 2 data blocks in x Lanes, while preserving the Symbol placement rules of PCIe. For an Ordered Set (OS) Block that comes at the conclusion/start of a data stream, the conversion rules are as follows to generate 2 blocks from one OS block:

SKP (SKiP) OS: Generate a SKP OS followed by a Data Block with IDLs

EIEOS (Electrical Idle Exit Ordered Set): Implies goes to Recovery—send EIEOS followed by training Ordered sets EIOS (Electrical Idle Ordered Set): implies goes to EI—take the link to EI after sending out the EIOS SDS (Start Data Stream): Send SDS followed by a Data Block of IDL (IDLe).

For the reverse direction (e.g., 2 x8 Gen 5→1 x16 Gen 4), two data blocks are arranged into one, while preserving PCIe Symbol alignment rules. The challenge occurs when an Ordered Set block is received followed by a data block in the even set (or an Ordered Set block followed by a data block). Unlike a data block, Ordered Set block cannot be interleaved across two Lanes. Thus, the length of the Ordered Set block needs to be reduced by half and a data block and an Ordered Set Block may have to co-exist in the same block, which the Receiver should handle. The following rules are followed for the Ordered Set followed by a Data Block (or vice-versa):

Sending partial OS following the EDS if on odd boundary (variable length block if SKP OS follows)

If EIEOS—resume training; If EIOS: take link to EI

If OS is on even boundary, send the partial OS followed by half a block of data if SKP OS (variable length block, send half the SKP Symbols)

If OS is on even boundary and EIEOS: Send EIEOS and then resume training

If OS is on even boundary and EIOS: Send EIOS and take link EI

An alternative approach would be to require the transmitter Port to send two back to back Ordered Sets on an even block boundary so that the converter chip can send one full Ordered Set. Even in this scenario, for SKP Ordered Sets, it must send only half of the Symbols received across the two Ordered Sets (i.e., SKP Ordered Set can be variable length, as expected).

The initial link training to L0 occurs at Gen 1 data rate for the converter chip. If the link widths are known a priori (through software or strap pins or other sideband mechanism or a previous link training), both pseudo-ports of the converter chip link train to Gen 1 in lock-step similar to what a retimer does. When the width is unknown, the converter chip first trains the down pseudo-port to know the link widths, reset that pseudo-port(s), and then link train both sides in lock-step similar to a retimer. If both ports are capable of the same max data rate, the converter chip acts like a retimer and puts out identical link width on both sides.

If one port (say UP) has a lower max data rate than DN (e.g., Gen 4 UP and Gen 5 DN), the following steps should be followed:

Link train the DN to Gen 3 w/ EQ (Equalization), hold off the UP port to go to Gen 3

Link train the DN to Gen 4 and UP to Gen 3 simultaneously with 2 Lanes UP being synchronized to one Lane DN (frequency difference also exists)

UP Receive:

TS1'es on any one of the two Lanes or an EIEOS/SKP with prior OS being TS1=>Send TS1/EIEOS/SKP on the DN Lane for 2 Blocks;

No need to do Store and Forward—can look at the first Symbol and decide;

Ensure that the WFC device sends an EIEOS every 32 Blocks and SKP whenever the scheduled interval shows up (no need to match with whether EIEOS or SKP was received in the UP side at that precise interval);

Obtain deskew between the two Lanes as soon as the first TS1'es are received (monitor for any bit slip/SKP and readjust);

TS2'es on both Lanes=>Send TS2/EIEOS/SKP on DN Lane for 2 Blocks;

Send the first EIEOS on a TS1→TS2 transition and an EIEOS every 32 Blocks;

Send SKP when the interval is up or before sending SDS (as per the rule);

TS2'es otherwise.

SDS received on both Lanes: Send an SKP OS followed by SDS DN (SKP is a filler to catch up).

After this WFC device can send the Data Blocks as described earlier (now the WFC device receives the Data Stream from the UP port):

If the UP has a lower max data rate than DN (e.g., Gen 3 UP and Gen 4 DN), the following steps should be followed:

DN Receive:

{TS1, TS1}: Send TS1 UP;

{TS1, SKP}: Send TS1 Block Up: First half TS1 and Second Half SKP w/ one SKP sent every two SKPs received (last 4 Symbols=>2 Symbols as SKP_END, filler Symbol);

{SKP, TS1}: Send SKP OS UP with length equal to half of what was received w/proper SKP_END and parity bits;

{TS1, EIEOS}: Send TS1 followed by EIEOS UP, Ignore the next two OS;

{EIEOS, TS1}: Send EIEOS UP;

TS2'es permutation with SKP and EIEOS the same as TS1 above;

{TS1, TS2}: Send TS1 UP;

{TS2, SDS}: Send one OS Block—half TS2 and other half SDS UP;

{SDS, Data Block}: Send an OS Block UP—half SDS and the other half Data with the data striped across both Lanes.

What is claimed is:

1. An apparatus comprising:
a first port having a first link width comprising a first number of physical lanes, wherein the first port is receive data at a first frequency from a first integrated circuit block connected to the first port by the first number of physical lanes;
a second port having a different second link width comprising a different second number of physical lanes, wherein the second port is to transmit data at a different second frequency to a different, second integrated circuitry block connected to the second port by the second number of physical lanes; and
physical layer logic to:
receive, at the first port, a first data block arranged according to the first link width and the first frequency; and
create at least one second data block arranged according the second link width and the second frequency, wherein the at least one second data block includes information from the first data block arranged sequentially in the at least one second data block.

2. The apparatus of claim 1, wherein the first link width is larger than the second link width.

3. The apparatus of claim 2, wherein the physical layer logic comprises logic circuitry to:
receive the first data block, the first data block arranged according to the first link width;
create the second data block by mapping bytes from the first data block into the second data block, the second data block arranged according to the second link width; and
create a third data block by mapping remaining bytes from the first data block into the third data block, the third data block arranged according to the second link width.

4. The apparatus of claim 2, wherein the physical layer logic comprises logic circuitry to:
receive an ordered set block;
create the second data block according to the second link width by mapping bytes from the first data block into the second data block;
create a third data block according to the second link width by mapping remaining bytes from the first data block into the third data block; and
populate at least a portion of the third data block with bytes from the ordered set block.

5. The apparatus of claim 4, wherein the ordered set block comprises a skip ordered set (SKPOS), and the logic circuitry is to create the third data block according to the second link width, the third data block comprising a SKP OS block followed by idle bytes.

6. The apparatus of claim 4, wherein the ordered set block comprises an electrical idle exit ordered set (EIEOS), and the logic circuitry is to create the third data block according to the second link width with EIEOS bytes followed by training Ordered sets.

7. The apparatus of claim 4, wherein the ordered set block comprises an electrical idle ordered set (EIOS), the logic circuitry to create the third data block with EIOS bytes and set one or more links to electrical idle after transmitting the third data block.

8. The apparatus of claim 4, wherein the ordered set comprises a start data stream byte, the logic circuitry to transmit the SDS on one of the second or third data block, and create the third data block arranged according to the second link width with at least some idle bytes.

9. The apparatus of claim 2, wherein the first link width comprises a maximum link with associated with a link that is compliant with one of a generation 4 or generation 5 Peripheral Component Interconnect Express (PCIe) protocol and the second link width comprises a maximum link with associated with a link that is compliant with one of a generation 5 or generation 6 PCIe protocol, respectively.

10. The apparatus of claim 1, wherein the first link width is smaller than the second link width, and the first frequency is higher than the second frequency.

11. The apparatus of claim 10, wherein the physical layer logic comprises logic circuitry to:
    receive the first data block, the first data block arranged according to the first link width;
    receive a third data block, the third data block arranged according to the first link width; and
    create the second data block by mapping bytes from the first data block and the third data block into the second data block, the second data block arranged according to the second link width.

12. The apparatus of claim 10, wherein the physical layer logic comprises logic circuitry to:
    receive the first data block;
    receive a third block, the third block comprising an ordered set block;
    create the second data block according to the second link width by mapping bytes from the first data block into the second data block;
    populate at least a portion of the second data block with bytes from the ordered set block after an end data stream byte.

13. The apparatus of claim 10, wherein the first link width comprises a maximum link with associated with a link that is compliant with one of a generation 5 or generation 6 Peripheral Component Interconnect Express (PCIe) protocol and the second link width comprises a maximum link with associated with a link that is compliant with one of a generation 4 or generation 5 PCIe protocol, respectively.

14. The apparatus of claim 1, wherein the physical layer logic comprising multiplexer circuitry to map bytes from the first data block to the second data block.

15. The apparatus of claim 1, wherein the apparatus comprises a retimer.

16. A method comprising:
    receiving, at physical layer logic of a first port of a converter device, a data block arranged according to a first link width, wherein the first port comprises a first number of physical lanes corresponding to the first link width, and the first port is receive data at a first frequency from a first device;
    mapping, by the physical layer logic, bytes from the data block to a second data block, wherein the second data block is arranged according to a second link width, and the second link width is different from the first link width; and
    transmitting the second data block across a link to another second device using a second port of the converter device, wherein the link support comprises a different second number of physical lanes corresponding to the second link width, and the second port transmits data at a second frequency different from the first frequency.

17. The method of claim 16, wherein the first link width is larger than the second link width, the method comprising:
    mapping bytes sequentially from the first data block into the second data block and into a third data block.

18. The method of claim 17, further comprising:
    receiving an ordered set block;
    mapping at least some of the ordered set block into one of the second data block or the third data block.

19. The method of claim 17, wherein the ordered set block comprises one of a skip ordered set, an electrical idle ordered set, or an electrical idle exit ordered set.

20. The method of claim 16, wherein the first link width is smaller than the second link width, the method comprising:
    mapping bytes sequentially from the first data block into the second data block; and
    mapping bytes sequentially from a third data block into remaining bytes of the second data block, the third data block received after the first data block.

* * * * *